(12) United States Patent
Seeley et al.

(10) Patent No.: US 10,502,632 B2
(45) Date of Patent: Dec. 10, 2019

(54) HIGH PRECISION WAVELENGTH MEASUREMENT AND CONTROL OF A TUNABLE LASER

(71) Applicant: Intuitive Surgical Operations, Inc., Sunnyvale, CA (US)

(72) Inventors: Ryan Seeley, Christiansburg, VA (US); Mark E. Froggatt, Blacksburg, VA (US)

(73) Assignee: Intuitive Surgical Operations, Inc., Sunnyvale, CA (US)

( * ) Notice: Subject to any disclaimer, the term of this patent is extended or adjusted under 35 U.S.C. 154(b) by 36 days.

(21) Appl. No.: 15/677,146

(22) Filed: Aug. 15, 2017

(65) Prior Publication Data
US 2018/0010967 A1 Jan. 11, 2018

Related U.S. Application Data

(62) Division of application No. 12/735,813, filed as application No. PCT/US2009/034664 on Feb. 20, 2009, now Pat. No. 9,766,131.

(Continued)

(51) Int. Cl.
*G01J 9/02* (2006.01)
*H01S 3/13* (2006.01)

(52) U.S. Cl.
CPC .......... *G01J 9/0246* (2013.01); *H01S 3/1303* (2013.01); *H01S 3/1305* (2013.01); *H01S 3/1307* (2013.01)

(58) Field of Classification Search
CPC ........ H01S 3/13; H01S 3/1305; H01S 3/1303; H01S 3/1392; H01S 3/1304; H01S 3/1394; H01S 3/1398
See application file for complete search history.

(56) References Cited

U.S. PATENT DOCUMENTS

| 4,817,100 A | 3/1989 | Cameron et al. |
| 6,426,496 B1 | 7/2002 | Froggatt et al. |

(Continued)

FOREIGN PATENT DOCUMENTS

| JP | S63502391 A | 9/1988 |
| JP | 2002205340 A | 7/2002 |

(Continued)

OTHER PUBLICATIONS

Extended European Search Report for Application No. EP09712064.6, dated Apr. 15, 2011, 9 pages.

(Continued)

*Primary Examiner* — Xinning(Tom) Niu
*Assistant Examiner* — Sean P Hagan
(74) *Attorney, Agent, or Firm* — Schwegman Lundberg & Woessner, P.A.

(57) ABSTRACT

A tunable laser system includes a tunable laser to be scanned over a range of frequencies and an interferometer having a plurality of interferometer outputs. At least two interferometer outputs of the plurality of interferometer outputs have a phase difference. A wavelength reference has a spectral feature within the range of frequencies, and the spectral feature does not change in an expected operating environment of the tunable laser. Processing circuitry uses the spectral feature and the plurality of interferometer outputs to produce an absolute measurement of a wavelength of the tunable laser and controls the tunable laser based on a comparison of the absolute measurement of the wavelength of the tunable laser with a setpoint wavelength.

20 Claims, 21 Drawing Sheets

Related U.S. Application Data

(60) Provisional application No. 61/030,429, filed on Feb. 21, 2008, provisional application No. 61/146,448, filed on Jan. 22, 2009.

(56) References Cited

U.S. PATENT DOCUMENTS

| | | | |
|---|---|---|---|
| 6,445,477 | B1 | 9/2002 | Madsen et al. |
| 7,110,119 | B2 | 9/2006 | Maestle |
| 9,766,131 | B2 | 9/2017 | Seeley et al. |
| 2002/0075079 | A1* | 6/2002 | Oblak ............... G04F 5/14 331/3 |
| 2002/0131045 | A1 | 9/2002 | Anderson |
| 2002/0149779 | A1 | 10/2002 | Stolte et al. |
| 2003/0026301 | A1 | 2/2003 | Pianciola et al. |
| 2003/0107743 | A1 | 6/2003 | Van Wiggeren |
| 2004/0120369 | A1* | 6/2004 | Fairgrieve ........ G11B 7/1263 372/29.021 |
| 2004/0151220 | A1* | 8/2004 | Schnatz ............ H01S 3/1303 372/32 |
| 2004/0246492 | A1 | 12/2004 | McAlexander |
| 2005/0030986 | A1* | 2/2005 | Farrell ............ H01S 5/06256 372/32 |
| 2006/0044562 | A1 | 3/2006 | Hagene et al. |
| 2006/0119857 | A1 | 6/2006 | Steffens et al. |
| 2011/0122906 | A1 | 5/2011 | Seeley et al. |

FOREIGN PATENT DOCUMENTS

| | | |
|---|---|---|
| JP | 2002305340 A | 10/2002 |
| JP | 2002365142 A | 12/2002 |
| JP | 2003517732 A | 5/2003 |
| JP | 2005003680 A | 1/2005 |
| JP | 2006502391 A | 1/2006 |

OTHER PUBLICATIONS

International Search Report and Written Opinion for Application No. PCT/US2009/034664, dated Aug. 28, 2009, 7 pages.
International Preliminary Report on Patentability for Application No. PCT/US2009/034664, dated Sep. 2, 2010, 6 pages.
Official Action with English Summary dated Nov. 5, 2013 for Japanese Application No. 2010547792, 7 pages.

* cited by examiner

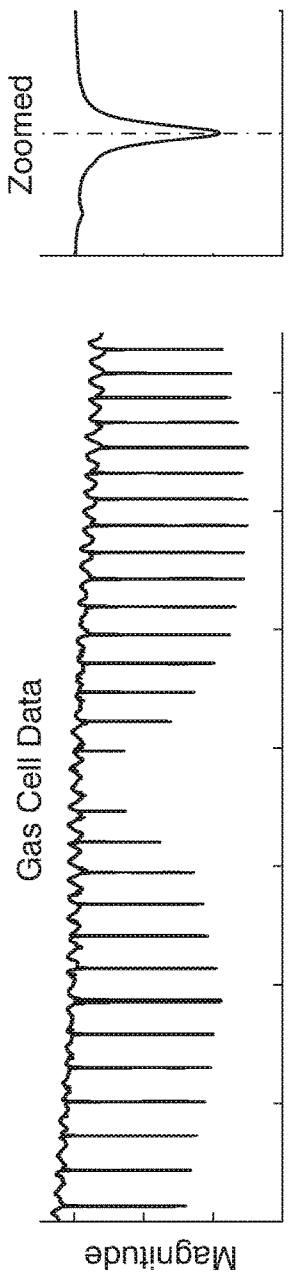
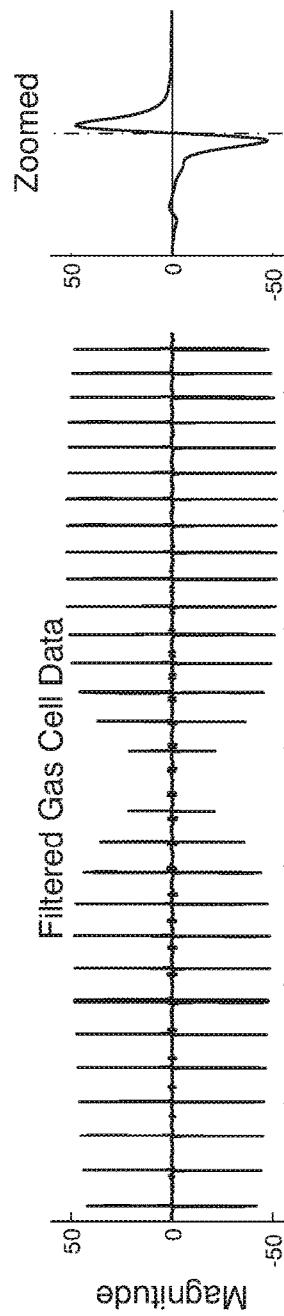
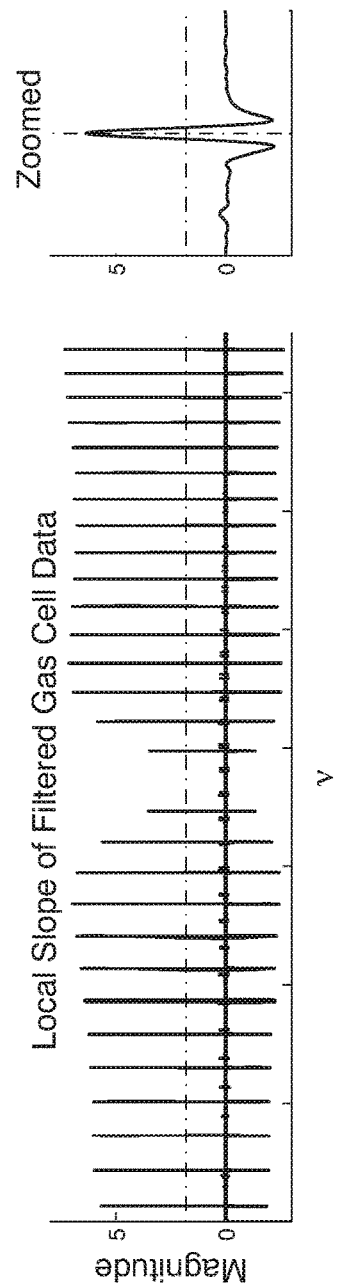
FIG. 10A
FIG. 10B
FIG. 10C

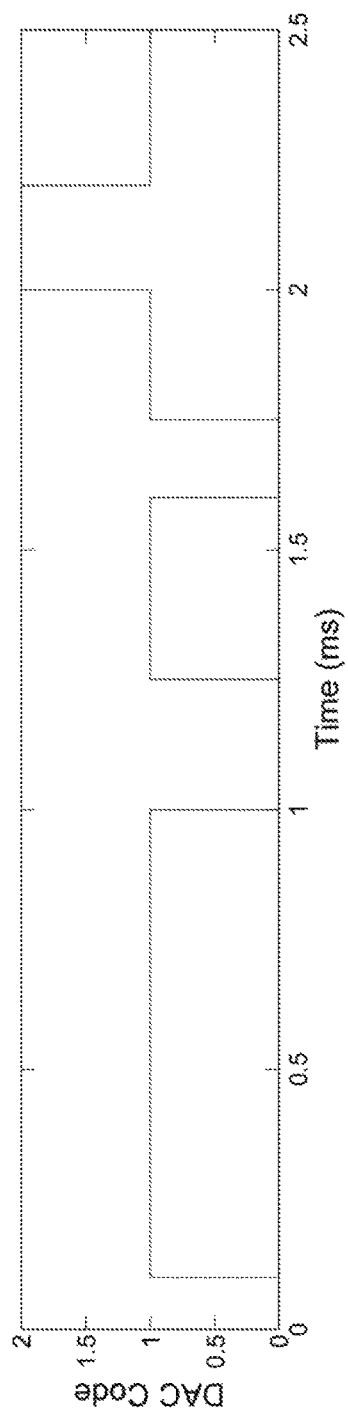
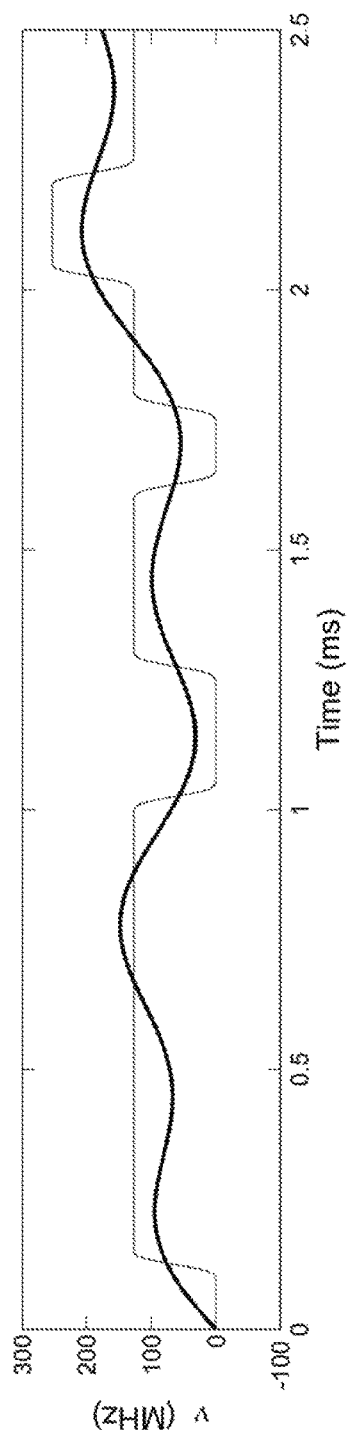
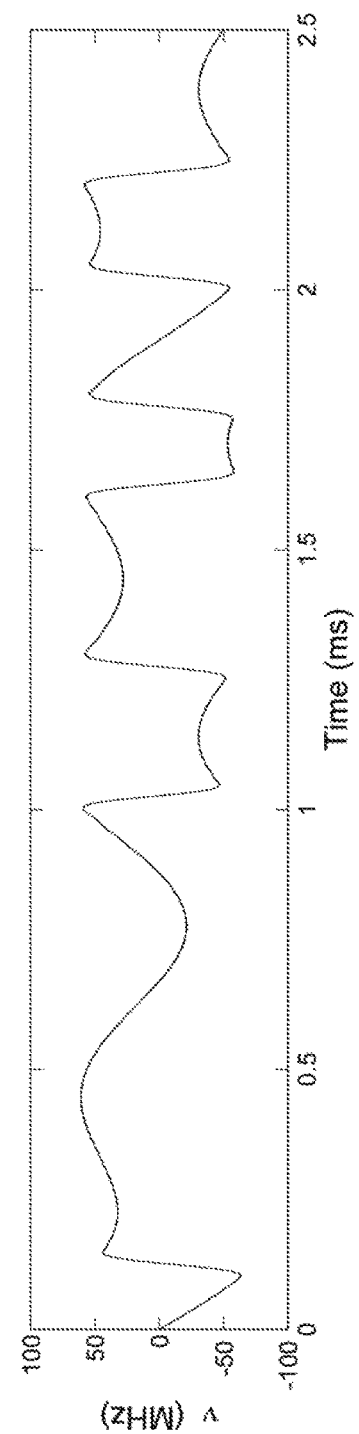
FIG. 20A
FIG. 20B
FIG. 20C

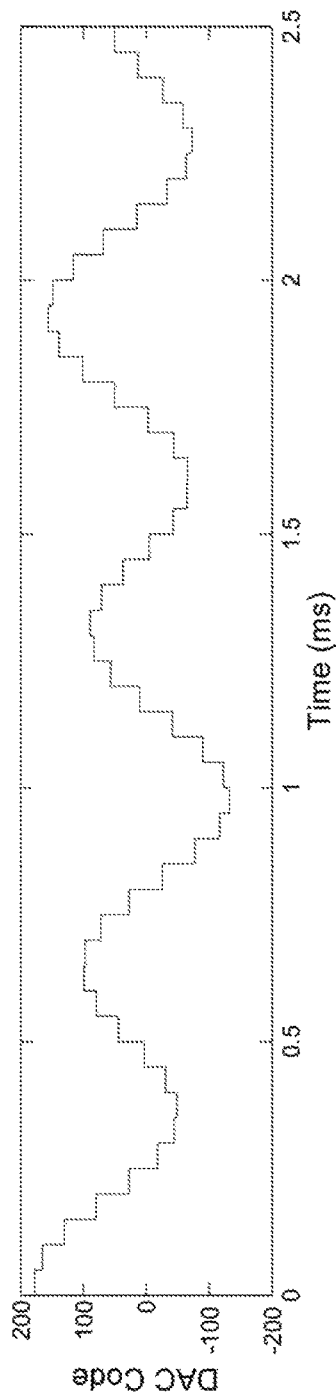
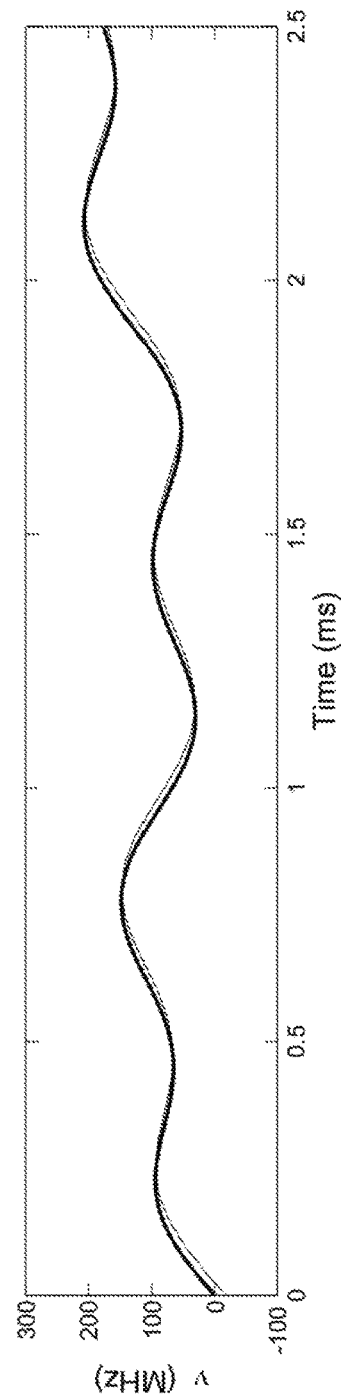
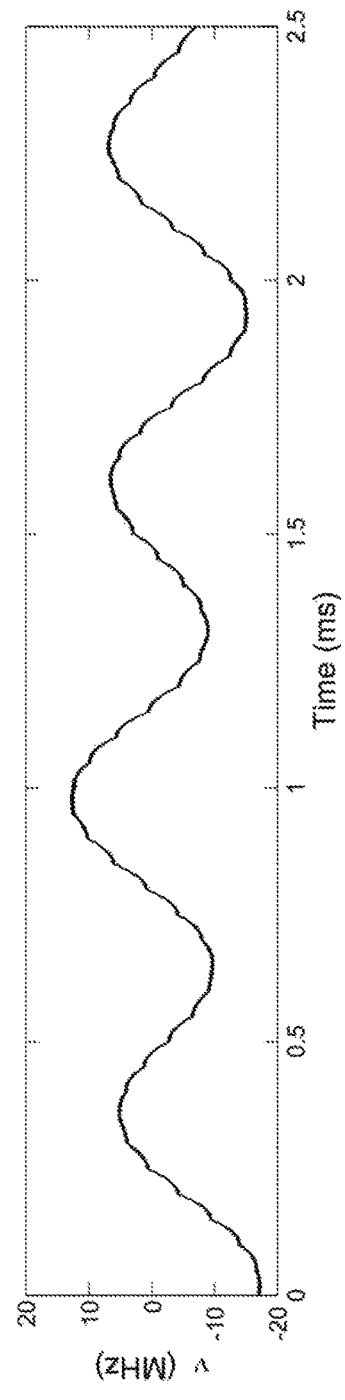
FIG. 21A
FIG. 21B
FIG. 21C

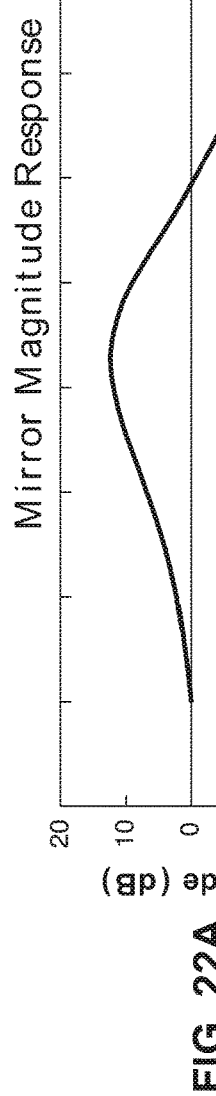
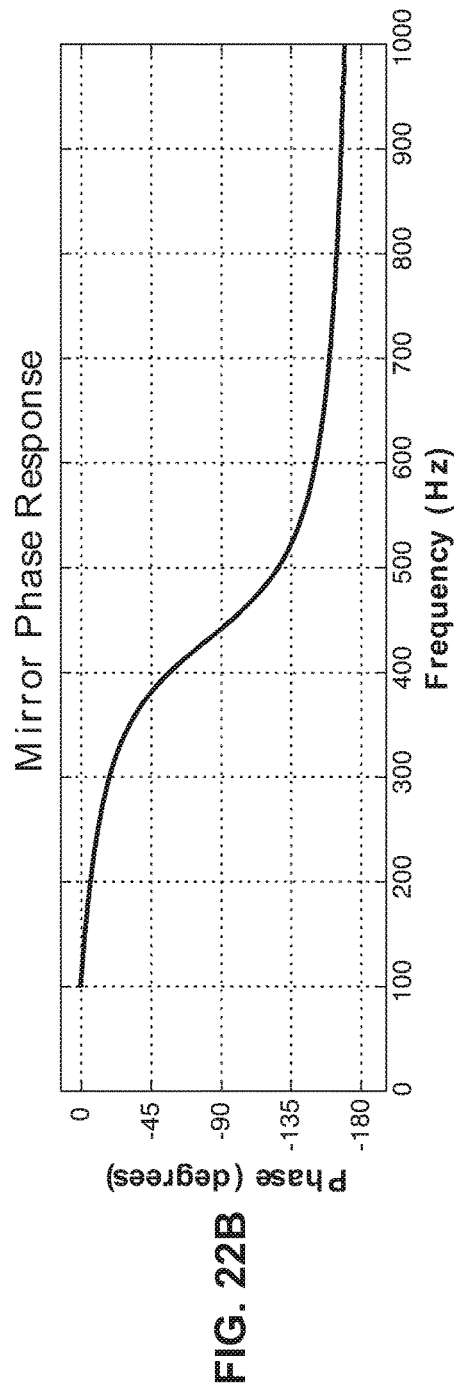
FIG. 22A
FIG. 22B

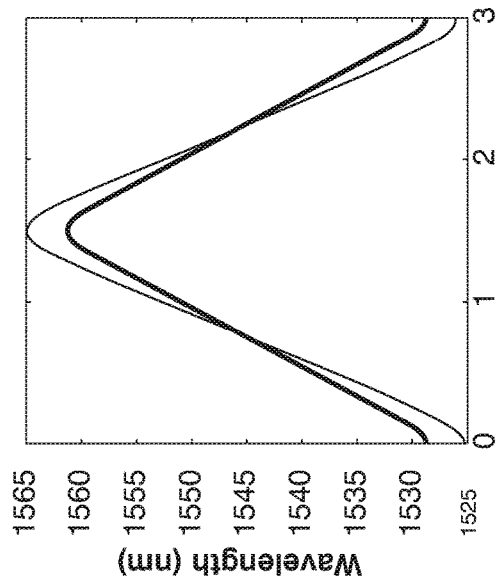
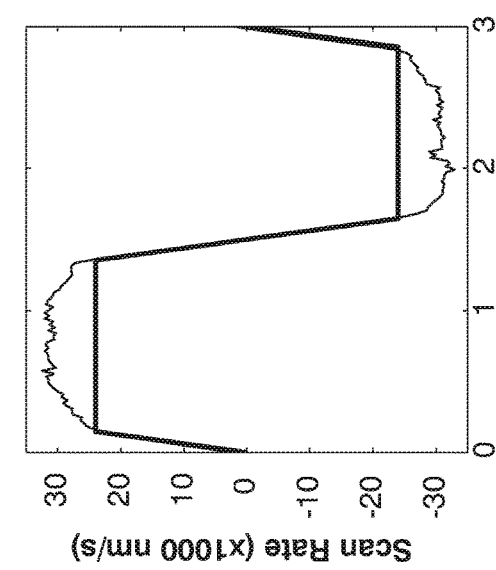
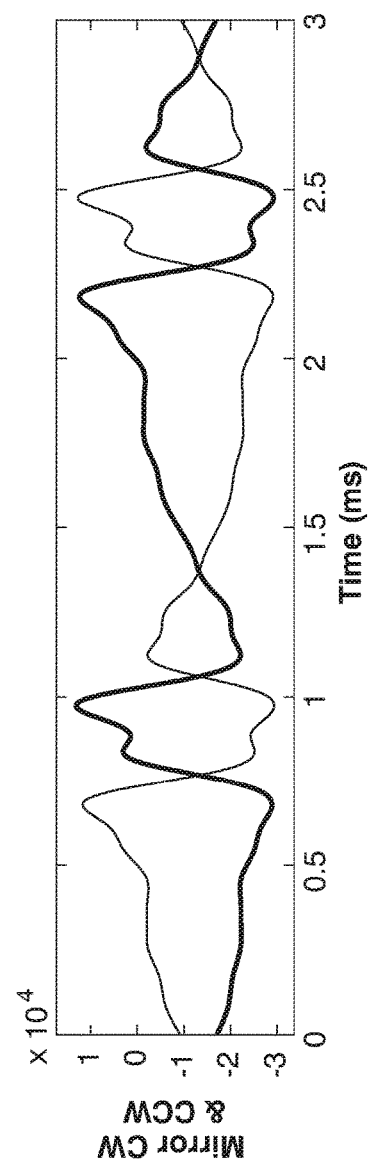
FIG. 26A
FIG. 26B
FIG. 26C

HIGH PRECISION WAVELENGTH MEASUREMENT AND CONTROL OF A TUNABLE LASER

RELATED APPLICATION

This application is a divisional of U.S. application Ser. No. 12/735,813 filed Nov. 8, 2010, which is the U.S. national phase of International Application No. PCT/US2009/034664, which designated the U.S. and claims the priority and benefit of U.S. provisional patent applications 61/030,429, filed Feb. 21, 2008 and 61/146,448, filed on Jan. 22, 2009, which are incorporated herein by reference in their entirety.

TECHNICAL FIELD

The technology relates to tunable lasers and measurement and control of the wavelength of the laser output.

BACKGROUND

Tunable lasers have been widely used over the past several decades to measure the wavelength response of optical systems. Early applications were primarily in spectroscopy. Since the advent of wavelength division multiplexing in optical telecommunications, tunable laser applications have increased in the field of telecommunications components measurement.

FIGS. 1A and 1B show examples of wavelength-tunable tunable lasers. In each case, inputs can be applied to various actuators to effect a particular wavelength response in the optical output. FIG. 1A shows an example distributed feedback (DFB) laser (10). The laser cavity in this example is formed by the reflective facets of the laser diode 12. The output facet of the diode is slightly less reflective than the rear facet. Collimation optics 13 can be included to couple the output beam to an optical fiber. A periodic refractive index variation (grating) 11 is written in the laser diode during manufacture; the output wavelength is proportional to the period of this refractive index modulation. In this DFB example, the output wavelength can be tuned both by varying the temperature of the device via the thermo-electric cooler (TEC) 14, or by varying the laser diode current.

FIG. 1B shows an example external cavity laser 20 in a Littman-Metcalf configuration. The laser cavity is formed by the output facet of the laser diode 24 and the final reflection of the diffraction grating 22. This type of laser is wavelength tunable via variation of mirror 21 angle, optical cavity length, diode current, and cavity temperature. Rotation of the mirror and subsequent wavelength-selective reflection from the diffraction grating result in a very high degree of wavelength response compared to that due to variations in other inputs listed above. The geometry is organized such that cavity length is approximately preserved as the mirror is rotated, such that mode hops (instantaneous jumps in optical frequency) are mitigated. Collimation optics 23, 25 and an isolator 26 are used to focus and couple the laser beam to the fiber output, and ensure that stray reflections from the network do not enter the laser cavity, respectively.

The term "tunable laser" refers to wavelength tunable lasers. A tunable laser measurement system includes a laser and a measurement device and/or method for determining the wavelength of the laser. A tunable laser control system includes a mechanism for calculating an error signal corresponding to the difference between current wavelength and a desired setpoint. The error signal is used to drive the laser actuator(s).

A key component for a tunable laser measurement or controls system is the wavelength measurement itself. Various types of instruments and methods that can be used for this include the following, among others: Fizeau interferometer, grating spectrum analyzer, Fourier spectrometer, and etalon/wavelength reference combination. Additional methods include mapping wavelength response to actuator angle or position.

It is desirable that the measured wavelength signal exhibits the following characteristics:

1—directional: the wavelength measurement contains information about the direction of the laser tuning, 2—continuous: the measurement is available continuously, both temporally, and across the tuning range of the laser, 3—high accuracy: for applications such as spectroscopy and optical sensing, accuracy down to sub-pm levels is favorable and in some cases crucial, 4—high precision: accuracy is rarely meaningful unless precision is, at a maximum, equal to the accuracy of the control; many applications benefit from precision orders of magnitude better than accuracy, 5—absolute information: without absolute information, it is possible only to obtain a relative wavelength measurement; an unknown wavelength offset will exist between the wavelength measurement and actual wavelength, 6—no or negligible drift: many applications are sensitive to short- or long-term drift, 7—low latency: this requirement is particularly applicable to utilization of the wavelength measurement in a controls system; latency refers to the time taken between light exiting the laser and applying appropriate corrective signals to laser actuators. Time taken in calculation of the error signal contributes to the total latency, which latency is inversely proportional to feedback loop bandwidth; higher frequency control is available with decreasing latency.

A wavelength measurement based on any one of the measurement methods mentioned above does not fulfill these characteristics. Consider measurement of actuator angle and inference/calibration of angle to output wavelength for an external cavity laser, an example of which is shown in FIG. 1B. Given the strong correlation between the wavelength of the laser and the angle of the actuator tuning element, an approach to measuring the laser wavelength is to provide a high-resolution measurement of this angle using optical beam displacement or angle encoding. Wavelength is mapped to mirror actuator angle. In a controls application, an error signal is calculated based on a current wavelength setpoint and the wavelength inferred from the mirror actuator angle measurement. The angle of the mirror can be controlled by an electrical signal which can be applied to an actuator used to rotate or displace the tuning element. This electrical signal is determined from the error signal. Employing this method, the wavelength measurement is typically corrupted by a mismatch between actuator response and actual wavelength response and also by noise in angle detection. The result is a measurement that is neither high precision nor high accuracy. Indeed, to achieve tens-of-fm precision over an appreciable laser scan range (typically several tens or hundreds of nm), a signal to noise ratio (SNR) of 120-140 dB is required; this is well beyond the capability of such electro-mechanical systems. Moreover, drift in the wavelength measurement will likely at least be on the order of the precision of the measurement, and will therefore also be significant.

Consider a second possible error signal measurement technique that uses a combination of an etalon and wavelength reference. A wavelength reference (in the form of a gas cell, stabilized Bragg grating, etc.) provides absolute wavelength information. A gas cell provides high-accuracy, absolute wavelength information in the form of molecular absorption lines, which move negligibly with change in temperature or atmospheric pressure. An etalon provides a relative measurement of wavelength. Relative wavelength information is encoded by etalon fringe number or fraction thereof from a reference fringe. The etalon signal, due to its high resolution and linearity, provides accurate and precise wavelength information between gas cell absorption lines. Thus, the combination of the two provides high accuracy, high precision, absolute wavelength information.

Primary drawbacks of this approach, however, include a lack of continuity and directionality. FIG. 2A shows an example of a gas cell signal (three absorption lines shown with each line corresponding to a particular stable, known wavelength). FIG. 2B is an example of an etalon signal where each signal period corresponds to an interference fringe (i.e., free spectral range of the etalon in optical frequency). Both FIGS. 2A and 2B represent measured etalon/gas cell signals for a linear sweep in optical frequency (inverse of wavelength). Symmetry in the vicinity of the troughs or peaks of the etalon signal destroys the ability to distinguish the direction of wavelength change of the laser output; in addition, amplitude variation versus wavelength (sensitivity) varies periodically, with zero sensitivity at troughs or peaks of the etalon signal. Thus, the measurement is not continuous.

From a control systems standpoint, another drawback is that the etalon/reference wavelength measurement technique only has low latency for specific applications such as locking to a limited set of wavelengths (which set of wavelengths is limited to sloped areas of the etalon signal other than the peaks and troughs). The locking approach is employed for "step tuned" lasers that only need to achieve a discrete set of wavelengths. If a laser is controlled with an etalon signal, it is possible for it to lose lock to the current known fringe and lock to another fringe, the number of which is unknown. The fringe number may have increased or decreased one or several counts. Relative and absolute wavelength information is therefore lost in such a case. If the laser optical frequency noise (high frequency variations in output wavelength) is greater than the free spectral range (FSR) of the etalon (the period of the signal), this will lead to random, intermittent locking to unknown fringes, destroying not only absolute information but also the ability to lock to a relative wavelength.

Another drawback is that smooth tuning is not possible using the etalon signal since its sensitivity is periodic. The free spectral range of the etalon could be decreased by bringing the etalon interference signals closer together to achieve a smoother scan by effectively having a large number of very small discrete steps. However, the result of this periodic sensitivity for swept wavelength tuning is, at best, an oscillatory output wavelength pattern, with a period of oscillation the same as that of the etalon signal. Thus, for smooth laser tuning applications, post-processing is required to infer the actual output wavelength values as the wavelength setting for the laser changes. This post-processing introduces a very large latency and thus makes the etalon/gas cell combination impractical for locking to an arbitrary wavelength or for smooth tuning of the laser.

The relative optical frequency of a laser source can be precisely measured using a 3×3 coupler and a fiber interferometer, as described in detail in U.S. Pat. No. 6,426,496 B1 "High Precision Wavelength Monitor for Tunable Laser Systems," Froggatt and Childers, the disclosure of which is incorporated herein by reference. This interferometer-based wavelength monitor provides an optical signal, the change in phase of which is proportional to the change in optical frequency of the laser source. It provides continuous, directional information, thus overcoming the aforementioned limitations of the etalon signal, while retaining its desirable qualities. Although the Froggatt et al patent describes a measurement system for a tunable laser, the measurement obtained lacks characteristics important to many wavelength measurement applications. The Froggatt et al patent does not teach using such a measurement system in a control system.

Indeed, the interferometer outlined in the Froggatt et al patent lacks several characteristics necessary for tunable laser control.

First, the interferometer lacks absolute information about the laser wavelength. It provides strictly a relative measurement, which alone cannot be used to infer the absolute wavelength, or to control a laser to a desired absolute wavelength. Second, due to the relative nature of the measurement, any errors in inferring wavelength from the wavemeter, however small, accumulate over time such that the resulting relative measurement is significantly corrupted. If the laser is tuned at a speed such that the sinusoidal signals from the interferometer exceed the Nyquist rate of the sampling system (or analog cutoff frequency in the case of an analog system) observing such signals, the fringe number (and therefore relative wavelength information) is lost, and error is accumulated. Vibration or mild shock of the laser can easily result in momentary tuning speeds in excess of the Nyquist rate or analog cutoff bandwidth, resulting in additional error. If a mode-hop occurs in the laser, (a common event for external cavity lasers), the wavelength monitor in Froggatt et al instantaneously accumulates a large error without any readily available way to correct that error. Further, if there is a loss of optical power, the laser monitor is unable to function properly. Upon restoration of power, there will be no information concerning the relationship of the current signal with that available before loss of power.

Third, the wavelength measurement drifts as the interferometer undergoes thermal changes. The interferometer is subject to thermal drift due to change in refractive index of the optical fiber with temperature, and also due to thermal expansion of the fiber. Indeed, in a fiber optic interferometer, thermal drift typically results in wavelength errors of approximately 10 pm/° C., regardless of the length difference in the two interferometer paths.

Thus, there is a need for a wavelength measurement system that overcomes these various deficiencies and that can generate an output which exhibits all of the desirable characteristics outlined above.

SUMMARY

An apparatus is provided for measuring the wavelength of a tunable laser with high speed, low latency, and high absolute accuracy. The apparatus includes an interferometer having at least two outputs with relative phases substantially other than 0° or 180°. The interferometer may be for example a Mach-Zehnder interferometer, a Michelson interferometer, or it may be formed on a photonic integrated circuit. A wavelength reference is provided that includes at least one spectral feature within the tuning range of the laser that does not change in an expected environment of the apparatus. In a non-limiting example embodiment, the wavelength reference includes a gas cell and the at least one spectral feature includes gas cell absorption lines. The apparatus further includes electronics arranged to use the spectral feature of the wavelength reference and the at least two interferometer outputs to produce an absolute measurement of the tunable laser wavelength.

In one example embodiment, the dynamic range of the absolute measurement of the tunable laser wavelength is on the order of 160 dB.

Another aspect of an embodiment of the apparatus is that the absolute measurement of the tunable laser wavelength has a high accuracy on the order of several picometers or less, a high precision on the order of several femtometers or less, and a drift on the order of several picometers or less.

In a preferred example, the two outputs are in-phase (I) and quadrature (Q) signals, and the I and Q signals are converted into a continuous phase signal that represents a relative measurement of the tunable laser wavelength. In one embodiment, the continuous phase signal is compensated for drift.

The electronics preferably include reference calibration circuitry that corrects for accumulated scaling and tracking errors in the continuous phase signal using the gas cell absorption line data to produce the absolute measurement of the tunable laser wavelength. The reference calibration circuitry may linearize the gas cell absorption line data based on the continuous phase signal and/or identify one or more gas cell lines in the gas cell absorption line data. For the latter, the reference calibration circuitry identifies one or more gas cell lines by filtering the gas cell absorption line data using a matched filter, analyzing the filtered data, and determining a derivative of the filtered data.

In one example embodiment, the reference calibration circuitry uses a difference between neighboring gas cell line values in the gas cell absorption line data to identify the absolute measurement of the tunable laser wavelength. A first-order fit may also be determined of differences between multiple neighboring gas cell line values in order to map a difference between an observed wavelength to the absolute measurement of the tunable laser wavelength. Still further, an error associated with the first-order fit may be corrected.

A tunable laser control system is also provided for controlling a laser output tuned to an arbitrary wavelength setpoint waveform during a scan. A tunable laser is arranged to be scanned over a range of wavelengths. A tunable laser wavelength measurement apparatus, e.g., like that described in the first paragraph of the summary, provides an absolute measurement of the tunable laser wavelength. A comparator compares the absolute measurement of the tunable laser wavelength from the tunable laser wavelength measurement apparatus to a setpoint wavelength and generates an error signal based on which the wavelength of the laser is controlled.

In one example embodiment, a dynamic range of the error signal produced by the electronics is on the order of 160 dB.

The error signal provides both information about the direction of the wavelength scan, and absolute wavelength error information. The absolute wavelength error signal has a high accuracy on the order of several picometers or less, a high precision on the order of several femtometers or less, and drift on the order of several picometers or less. Moreover, the error signal has a low latency, as small as on the order of tens of nanoseconds, which is inversely proportional to a bandwidth of a feedback loop used to generate the error signal and control the wavelength of the laser output.

In one non-limiting example embodiment, the tunable laser control system includes a digital feedback loop arranged to digitally determine and generate the error signal. A digital to analog converter produces an analog control signal from the digital error signal and provides the analog control signal to control the wavelength of the laser. In one practical application, the digital to analog converter has about 16-bits or less. It may be desirable in some applications to include an integrator for integrating an output from the digital to analog converter for producing the analog control signal provided to control the wavelength of the laser, thus increasing the dynamic range of the feedback loop.

In another practical application, the digital to analog converter is a delta-sigma digital to analog converter.

Yet another example embodiment employs an analog feedback loop arranged to generate the error signal in analog form and control the wavelength of the laser. The analog feedback loop includes two analog multipliers coupled to an analog differencer. Circuitry is provided arranged to generate setpoints for each of the two interferometer outputs. The analog multipliers multiply the interferometer outputs with a corresponding setpoint, and the analog differencer generates the analog error signal based on a difference between outputs from the two analog multipliers. The setpoints ensure that the two interferometer outputs track to an individual point on an ellipse defined by the tunable laser wavelength measurement apparatus.

An alternative example embodiment employs a digital feedback loop arranged to digitally determine and generate the error signal in digital form and an analog feedback loop arranged to generate the error signal in analog form and control the wavelength of the laser. This embodiment may be useful if the laser includes only one laser actuator if an analog summer is used to combine the signals. If only one actuator is used, the digital feedback loop controls the low-frequency regime of the actuator, while the analog feedback loop controls the higher-frequency regime of the actuator. This embodiment may also be useful if the laser includes multiple laser actuators controllable by a control signal. For example, the laser may include two or more of the following: a piezo actuator, a MEMS motor, and a laser diode. The digital feedback loop controls one of the laser actuators with a lower frequency response, and the analog feedback loop controls another of the laser actuators with a higher frequency response.

The setpoint wavelength may be a constant or it may determined based on a setpoint function that varies arbitrarily or periodically with time. For the latter periodic situation, the error signal may be used to control the setpoint function to generate a periodic wavelength control signal.

The tunable laser control system may be a causal control system or a non-causal control system.

BRIEF DESCRIPTION OF THE DRAWINGS

FIGS. 10A-10C illustrate a gas cell absorption line localization process showing gas cell data, filtered data, and slope of the filtered data, respectively;

FIGS. 20A-20C show a simulated direct actuator drive DAC waveform, system response to the DAC waveform versus setpoint waveform, and error between setpoint waveform and actual wavelength, respectively;

FIGS. 21A-21C show a simulated DAC waveform for a DAC/integrator combination actuator drive, system response to the DAC waveform/integrator combination versus setpoint waveform, and error between setpoint waveform and actual wavelength, respectively;

FIGS. 22A and 22B graph an example MEMS motor/mirror magnitude and phase response, respectively (angular rotation of mirror with respect to input MEMS motor voltage);

FIGS. 26A-26C show example first guess mirror CW/CCW waveforms, scan speed response, and absolute wavelength, respectively.

DETAILED DESCRIPTION

The following description sets forth specific details, such as particular embodiments, procedures, techniques, etc. for purposes of explanation and not limitation. It will be appreciated by one skilled in the art that other embodiments may be employed apart from these specific details. In some instances, detailed descriptions of well known methods, circuits, and devices are omitted so as not to obscure the description with unnecessary detail. Moreover, individual blocks are shown in some of the figures. Those skilled in the art will appreciate that the function of such blocks may be implemented using individual hardware circuits, using software programs and data, in conjunction with a suitably programmed digital microprocessor or general purpose computer, using application specific integrated circuitry (ASIC), and/or using one or more digital signal processors (DSPs) or field programmable gate arrays (FPGAs).

Figure 3:
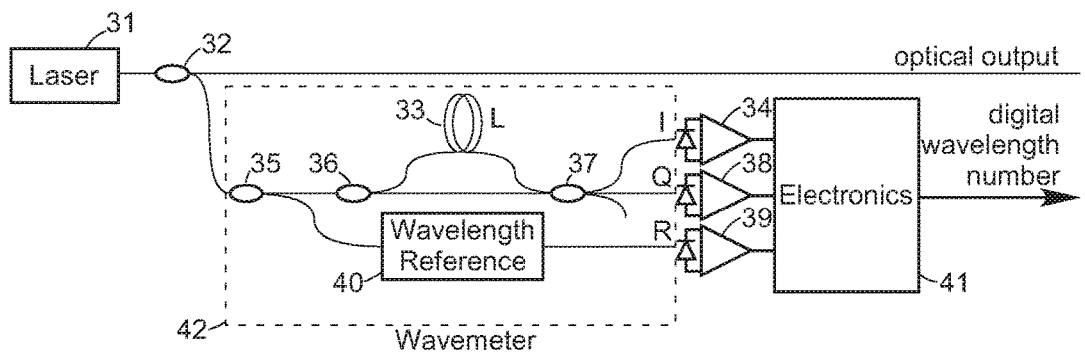
FIG. 3 shows a non-limiting example embodiment of a tunable laser wavelength measurement system.

A non-limiting example embodiment of a tunable laser wavelength measurement system 30 is shown in FIG. 3. A tunable laser 31 generates light, which light is coupled to an optical splitter 32 that outputs two branches: a laser output branch and measurement branch. The laser may any suitable laser. The wavemeter 42 includes an interferometer (e.g., implemented in fiber or in a photonic integrated circuit (PIC)) and optical wavelength reference 40, and is coupled to the measurement branch and outputs signals from which a very accurate measurement of the actual wavelength of the laser light can be inferred. The interferometer corresponds to a splitter 36, path length (L) difference 33, and a multi-port (e.g., 3×3 or greater) coupler 37. Electronics 34, 38, 39, 41, in the form of analog and/or digital hardware and algorithms, translate the phase tracking interferometer I and Q signals into a digital wavelength number incorporating most or all of the above identified desired characteristics.

Figure 4:
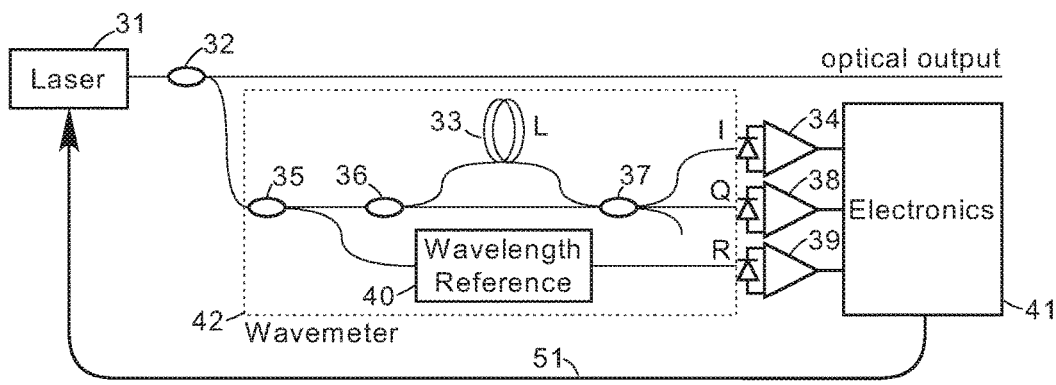
FIG. 4 shows a non-limiting example embodiment of a tunable laser control system.

A non-limiting example application of the tunable laser wavelength measurement system 30 is a tunable laser control system 50 shown in FIG. 4. The laser controlled may be any laser, but non-limiting examples include a MEMS tunable laser, a Littman-Metcalf design laser, a Littrow design laser, a distributed feedback laser, a ring laser, a Fabry-Perot laser, etc. Control system 50 includes an optical splitter 32, a wavemeter 42, electronics 41, as in FIG. 3, and also includes a feedback signal path 51 to a laser actuator or actuators of laser 31. The electronics implement the measurement described in conjunction with FIG. 3. The electronics also create an error signal proportional to the difference between a desired wavelength setpoint and the wavelength measurement accomplished via use of the wavemeter, and create from the error signal an appropriate control signal or signals for driving a wavelength-sensitive tunable laser actuator or actuators.

Figure 5A:
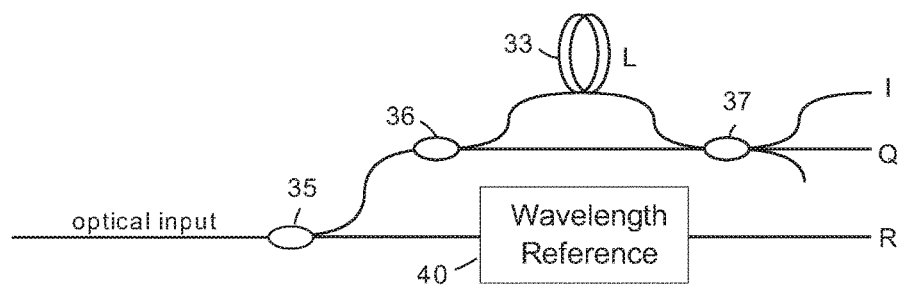
FIGS. 5A-5C show three example embodiments of an example wavemeter that generates signals for tracking absolute laser wavelength to extremely high absolute accuracy and precision.
Figure 5B:
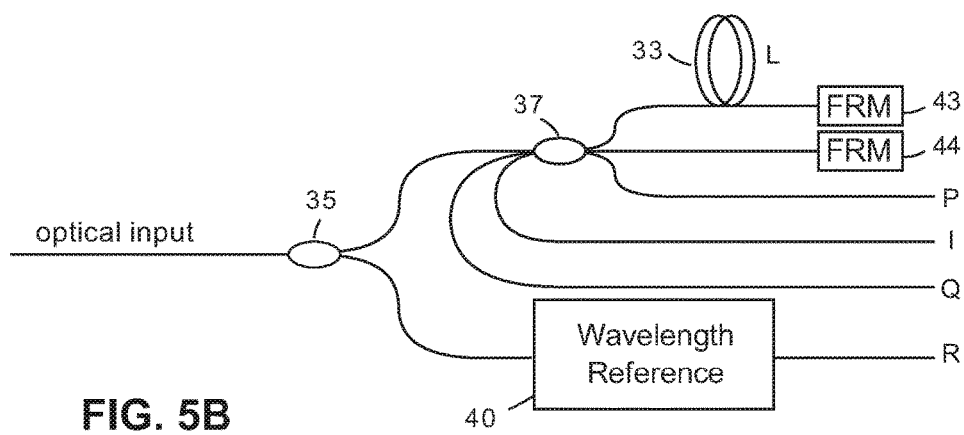
Figure 5C:
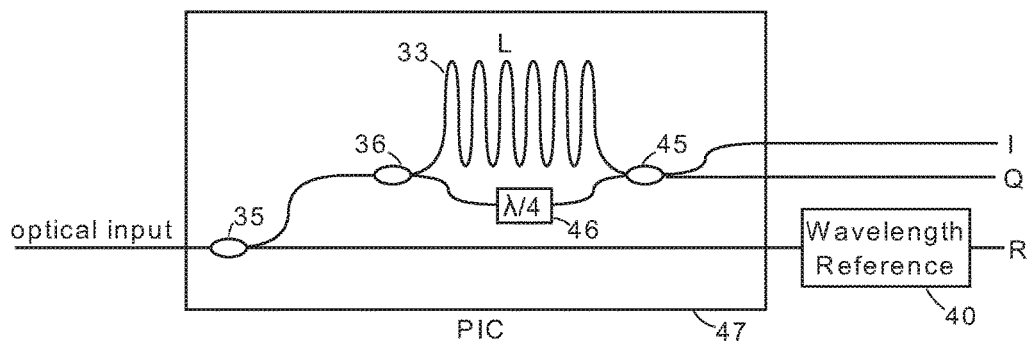

Returning to wavelength measurement and the wavemeter 42 from FIG. 3, FIGS. 5A, 5B, and 5C show alternative, non-limiting, example embodiments of a wavemeter 42 that generates signals for tracking changes in laser wavelength with very high precision and with absolute information, which signals are then used to control the laser wavelength. In these embodiments, the wavelength measurement device includes a phase tracking interferometer and a wavelength reference 40. FIGS. 5A, 5B, and 5C show only optical components. It is understood that optical detectors convert the optical signal into electrical signals at the outputs labeled I, Q, P, and R. In the example embodiment of FIG. 5B, the phase tracking interferometer is laid out in an alternative configuration. The Faraday rotator mirrors (FRM) 43, 44 ensure that there is no polarization fading when the fields interfere in the 3×3 coupler 37. One of the coupler outputs is tapped to function as a power monitoring signal (P) to detect the power of the laser light. In the example embodiment shown in FIG. 5C, the initial splitter 35 and interferometer 33, 36, 45 are integrated into a photonic integrated circuit 47. A delay element 46 serves to impart a necessary phase offset in one branch of the interferometer.

The wavemeter 42 shown in FIG. 3 achieves all of the desirable wavelength measurement characteristics described in the background including extremely accurate and precise wavelength measurement that is absolute, continuous, and directional measurement with very low latency and drift. When integrated into a controls system, since the wavelength setpoint is assumed to be well known and understood, the error signal has all these same desirable properties of the wavelength measurement signal, allowing for extremely precise wavelength control of a tunable laser. If the setpoint waveform has a repetitive nature, then all of these characteristics (save latency, which does not apply in this case) are achieved at frequencies even beyond phase inversion of the response of the actuators driven.

Continuity, directionality, and high precision are provided using an interferometric wavelength monitor including elements 36, 33, 37, 34, 38, and 41. However, such a wavelength monitor does not provide absolute information, is susceptible to a varied range of error sources (thus potentially destroying relative accuracy), and is also susceptible to drift. Notwithstanding these obstacles (explained in detail in the background), the inventors recognized the significant benefit this interferometric wavelength monitor could provide to tunable laser measurement and control systems, and that the sensitivities and problems associated with such an interferometer can be accommodated.

Figure 6:
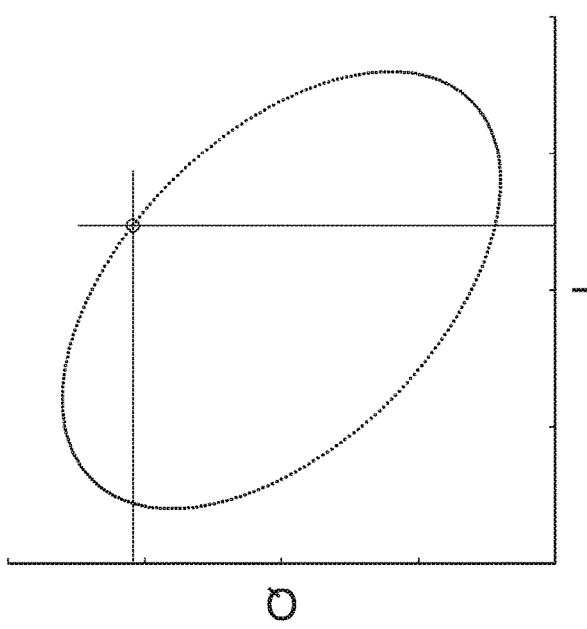
FIG. 6 shows a graph of Q voltage plotted versus I voltage, as output from the wavemeter of FIG. 5A, 5B, or 5C.

As shown in both FIGS. 5A and 5B, an optical coupler 37 (e.g., with three input/output ports or greater) is employed in one branch of the wavelength monitor to provide a phase shift necessary for quadrature demodulation (as described in the Froggatt et al patent) in order to track changes in optical frequency. If, for example, a 3×3 coupler is used, the Q signal will lead or lag the I signal by $2\pi/3$ radians. In FIG. 5C, a quadrature phase shift 46 of $\pi/2$ is directly built into the photonic integrated circuit 47. Thus, the signals are in quadrature, and can be represented as $$I(t) = K_I + A_I \cos(\theta(t))$$

$$Q(t) = K_Q + A_Q \cos(\theta(t) + \phi_o),$$

where $K_I$, $K_Q$ are signal offsets, $A_I$, $A_Q$ are amplitudes, $\phi_o$ is the phase offset imparted in the Q channel with respect to the I channel, and $\theta$ is the wavemeter phase. As seen in FIG. 6, where I is plotted on the x-axis and Q is plotted on the y-axis, in the case of a 3×3 coupler the signals form an ellipse which is traced in one direction as the laser scans up in wavelength, and the other way as the laser scans down. Depending upon the arbitrary selection of I and Q among the three output ports of the 3×3 coupler 37 shown in FIGS. 5A and 5B, clockwise movement along the ellipse either corresponds to increasing or decreasing wavelength. This relationship is determined by the hardware implementation (i.e., which 3×3 output ports are tapped and identified as "I" and "Q", and therefore is constant after manufacture.

The $2\pi/3$-offset signals can be manipulated to produce $\pi/2$-offset quadrature (sine and cosine) signals (thus producing a circle in a similar graph of Q versus I), from which a four-quadrant arctangent reveals the current phase angle. A change in this phase angle is directly proportional to a change in optical frequency of light incident on the input coupler. The difference in length L of the two branches of the Fabry-Perot (in the case of FIG. 5A or 5C) or Michelson (FIG. 5B) interferometer determines the free spectral range (FSR) of the interferometer. The FSR is the optical frequency change the laser must tune through which corresponds to one revolution of the ellipse formed by the I and Q signals.

Figure 7:
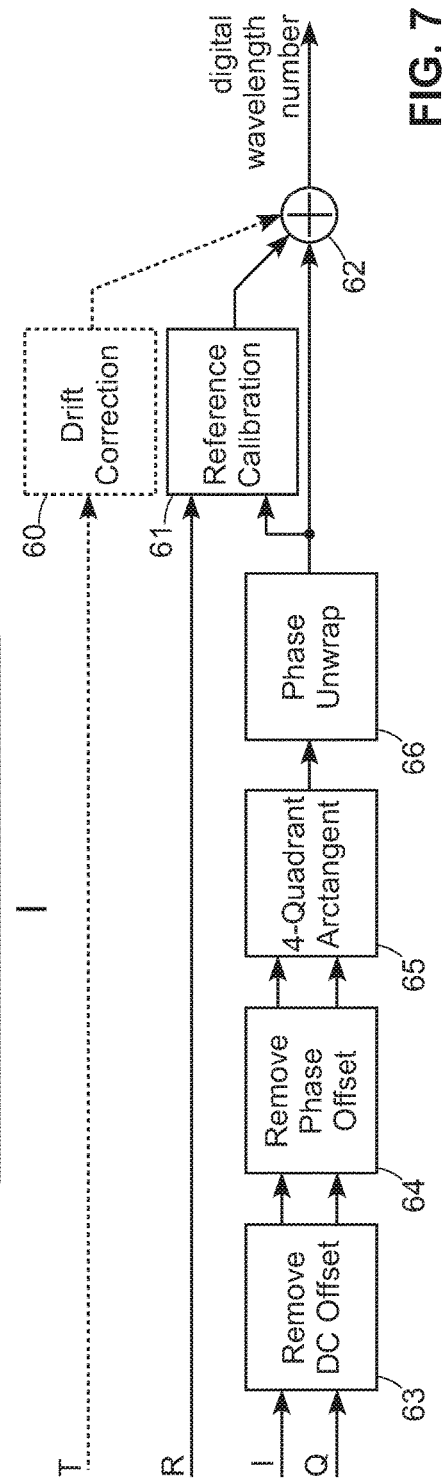
FIG. 7 illustrates a non-limiting example method for calculating an absolutely accurate, drift-free digital wavelength number based on wavemeter optical signals I, Q, and R, and, optionally, wavemeter temperature signal T.

The laser wavelength can be calculated with relatively low latency (~1 µs) using digital electronics represented as function blocks in the example embodiment of FIG. 7. In this figure, the offset of the quadrature I and Q signals is removed at 63, thus moving the I-Q ellipse to the origin. Next, the phase offset is removed at 64 to convert the $2\pi/3$-offset of the Q signal to a $\pi/2$ offset. A four-quadrant arctangent 65 extracts the current phase angle formed by the two signals. This arctangent can be implemented via a CORDIC (coordinate rotation digital computer) processor, configured to output the angle in a scaled format such that the range of the n-bit output corresponds to a range of $-\pi$ to $\pi$. A phase unwrap operation 66 employs a derivative and an accumulator to take advantage of the wrapping nature of the n-bit word to remove the phase wrapping inherent in the arctangent output, thus producing an unwrapped phase evolution as a function of time. This wavemeter phase is proportional to the optical frequency of the laser. The proportionality constant is the free spectral range of the wavemeter. The reference calibration 61 and drift correction 60 blocks yields an absolute, drift-free measurement. The reference calibration block 61 uses the wavelength reference signal R and unwrapped interferometer phase number, and outputs a correction number that, when added to the unwrapped interferometer phase number, yields an absolute wavelength measurement identified as a digital wavelength number. The drift correction block is optional and depends on the drift elimination method utilized. This drift correction block 60 uses the interferometer temperature, and outputs a correction number that counteracts the thermal effects in the interferometer I and Q signals.

Considering FIGS. 5A-5C, in the lower branch of the wavemeter, a detected reference signal (R) is generated by passing the laser light though a low-pressure gas cell wavelength reference 40. Example gases include hydrogen cyanide, acetylene (may be used for shorter wavelength ranges), and carbon monoxide (may be used for longer wavelength ranges). Inclusion of the reference results in absolute accuracy of the measurement. In FIG. 7, the reference calibration 61 converts the incoming reference signal R into a correction number that, when added to the relative number (unwrapped phase) from the phase accumulator, results in a number that is proportional to the actual wavelength of the laser, i.e., is absolutely accurate.

Figure 8:
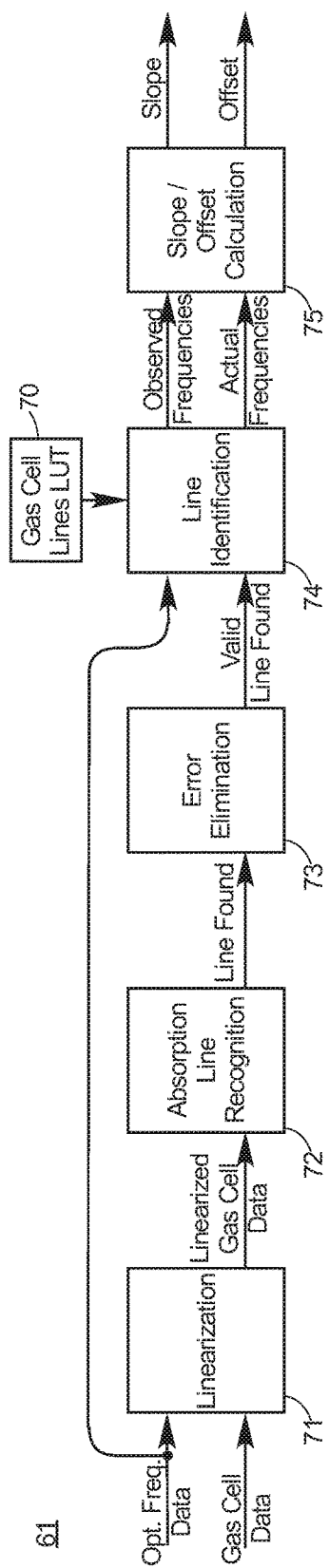
FIG. 8 illustrates a non-limiting example gas cell calibration procedure.

FIG. 8 shows a non-limiting example of the reference calibration 61. Some or all of the function blocks may for example be implemented in firmware used in the incorporation of real-time gas cell referencing in a laser wavelength control or measurement system. The linearization block 71 inputs optical frequency data and gas cell data, and performs interpolation or fractional-delay averaging to output gas cell data linear in optical frequency. The absorption line recognition block 72 filters the linearized gas cell data and outputs a data valid signal corresponding to found gas cell lines. The error elimination block 73 calculates an observed absorption line metric and eliminates incorrect values. In addition, it may inspect the derivative of the absorption line metric values to further identify and flag potential errors. The line identification block 74 maps absorption line metric to gas cell memory—or look-up table (LUT) 70—address, and appropriately addresses the LUT, outputting both the observed and actual optical frequency for each valid, observed absorption line. Finally, the slope/offset calculation block 75 calculates slope and offset correction values based on a set of observed and actual absorption line frequencies.

In some applications, the slope calculation is not needed and can be removed. If the laser sweep speed is not expected to depart significantly from a constant, known value, the linearization process 71 may not be needed. For some configurations where error sources are sufficiently eliminated, the error elimination block 73 may be removed. Individual blocks of the algorithm will now be described in greater detail.

Figure 1A:
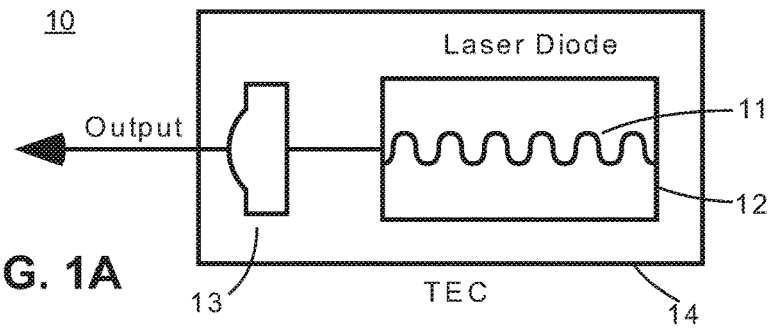
FIG. 1A shows an example DFB laser.
Figure 1B:
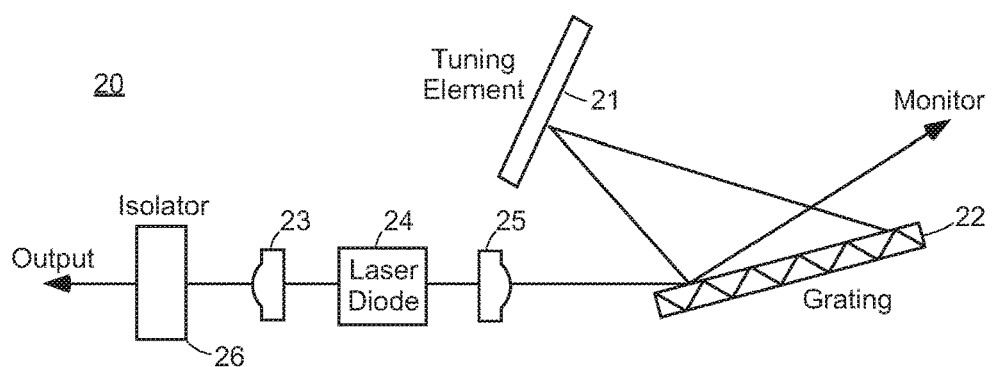
FIG. 1B shows an example Littman-Metcalf external cavity laser (ECL)
Figure 2A:
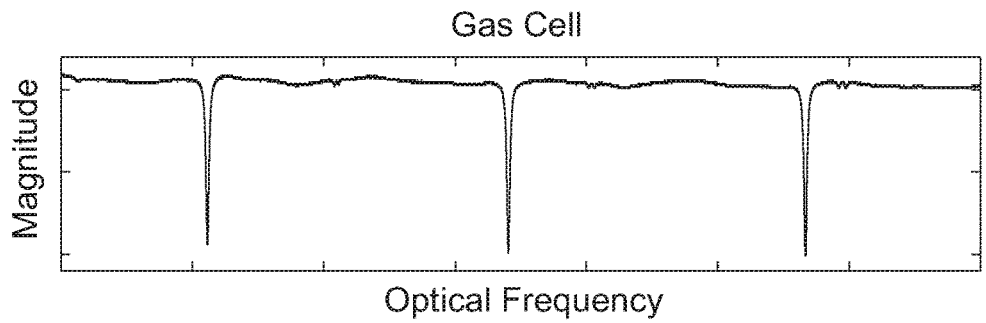
FIGS. 2A and 2B are graphs of gas cell and etalon signals, respectively, for a linear sweep in wavelength.
Figure 2B:
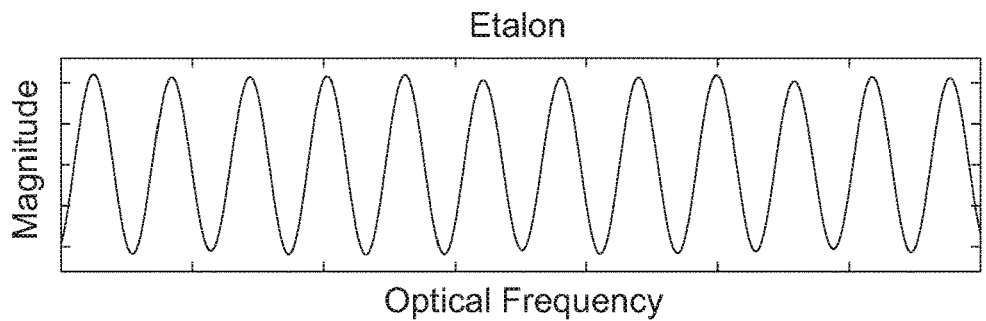

The absorption line recognition block 72 is perhaps the most critical element of the gas cell calibration process. FIG. 2A shows representative gas cell data as a laser is tuned linearly in optical frequency. The width and depth of the lines are determined by the type and pressure of the gas in the cell. The width and depth are therefore invariant over time and are similar over all absorption lines. Recognizing this relationship, a filter can be constructed to extract information from the gas cell waveform as a function of time. An example filter is a Canny edge detection filter, formed by taking the first derivative of a Gaussian distribution, which serves to suppress white (random) noise in the gas cell trace while yielding a signal, the zero crossings of which correspond to the center of a gas cell absorption line. The width of the filter is appropriately matched to the expected width of the absorption line, yielding a filter that suppresses noise and other extraneous signals.

Figure 9:
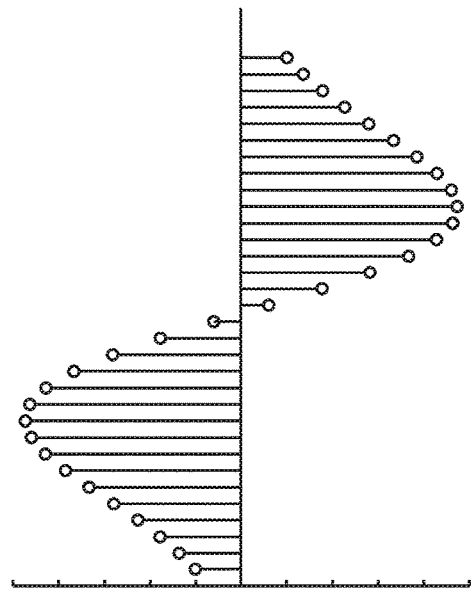
FIG. 9 is a graph of a gas cell absorption line detection and localization filter.

FIG. 9 is a plot of an example matched filter impulse response for a particular gas cell and laser sweep rate. The example filter's impulse response is implemented using a Finite Impulse Response (FIR) digital filter, and the gas cell data is passed through the FIR filter.

FIG. 10A shows a typical gas cell curve (where ν on the x-axis denotes optical frequency). FIG. 10B shows the resulting signal after filtering with the matched filter, and FIG. 10C shows a graph of the derivative of the filtered signal in FIG. 10B. The "zoomed" portions show details of the curves that appear as bold vertical lines in the main figures. The size and direction of the derivative filter signal in FIG. 10C can be used to identify the presence of gas cell lines, and the zero crossing of the filtered signal in FIG. 10B can be used to identify the precise location in the sequence of points where the absorption line was centered. FIG. 10C shows an example threshold (horizontal, dotted line) that can be used to identify zero crossing points in FIG. 10B that actually correspond to absorption lines. If the local slope (FIG. 10C) of the filtered gas cell data (FIG. 10B) exceeds the threshold, and a zero crossing is detected in the filtered gas cell data (FIG. 10B), the absorption line recognition block asserts its output (data valid signal) during that sample.

Simultaneous with this filtering operation, an optical frequency accumulator, i.e., the output of block 66 in FIG. 7, is used to track the current wavelength (relatively accurate but containing an offset) of the laser. At each sample corresponding to a central point of a gas cell absorption line, the current wavelength is saved to memory space separate from the LUT for further processing. These current wavelength numbers saved in memory are referred to below as observed gas cell line frequencies.

Since implementation of a FIR filter in digital logic can utilize significant resources, it is preferable to keep the implementation as small as possible or practical, and adjust incoming data to match the filter. Thus, rather than adjusting the matched filter every time the laser scan speed changes, the gas cell signal is appropriately resampled so that it arrives at the filter in samples that are evenly-spaced in optical frequency rather than time. The matched filter then remains the same for all sweep rates; even highly variable sweeps can be accommodated.

The linearization block 71 ensures that output samples of gas cell data are linear in optical frequency. Because the interferometer provides precise information about the change in the optical frequency, its output can be used to accomplish this linearization. The linearization algorithm can be implemented using a register and an accumulator. In this case, the optical frequency derivative is tied to the input of the accumulator. As the accumulator integrates the optical frequency derivative, the output of the accumulator will wrap in even increments of optical frequency. Each time the accumulator wraps, the register (the input of which is tied to the incoming gas cell data) is enabled. The optical frequency spacing of individual points can be adjusted by changing the width of the accumulator, or by multiplying the optical frequency derivative by a scaling factor. More complex, higher performance linearization algorithms are also possible.

Figure 11:
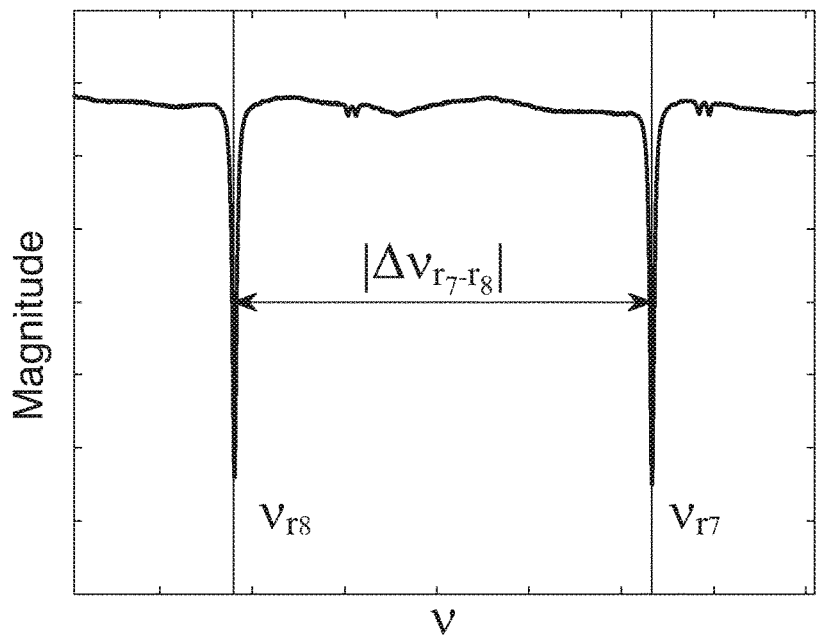
FIG. 11 shows the origins of a gas cell absorption line metric.

Because an offset exists between the observed gas cell line values and their corresponding actual optical frequencies, the observed values themselves cannot be used to infer the actual values. However, the difference between neighboring gas cell line values can be used to uniquely identify the corresponding actual gas cell value. This is the goal of the line identification block 74 of FIG. 8. Consider FIG. 11, which shows two absorption lines of a hydrogen cyanide gas cell, in this case the $7^{th}$ and $8^{th}$ lines of the R branch. The metric $|\Delta \nu_{r7-r8}|$ is obtained by taking the difference between optical frequencies of successive observed lines. Suppose that, in the absorption line recognition step 72, observed line frequencies $\nu_{R7}$, $\nu_{R8}$ were recorded. Because an offset exists between the observed and actual optical frequencies, the observed $\nu_{R7}$, $\nu_{R8}$ do not match the actual optical frequencies corresponding to lines R7 and R8 of the HCN gas cell. However, the difference between neighboring lines of an HCN gas cell (as shown in the top graph of FIG. 12) are unique.

Figure 12:
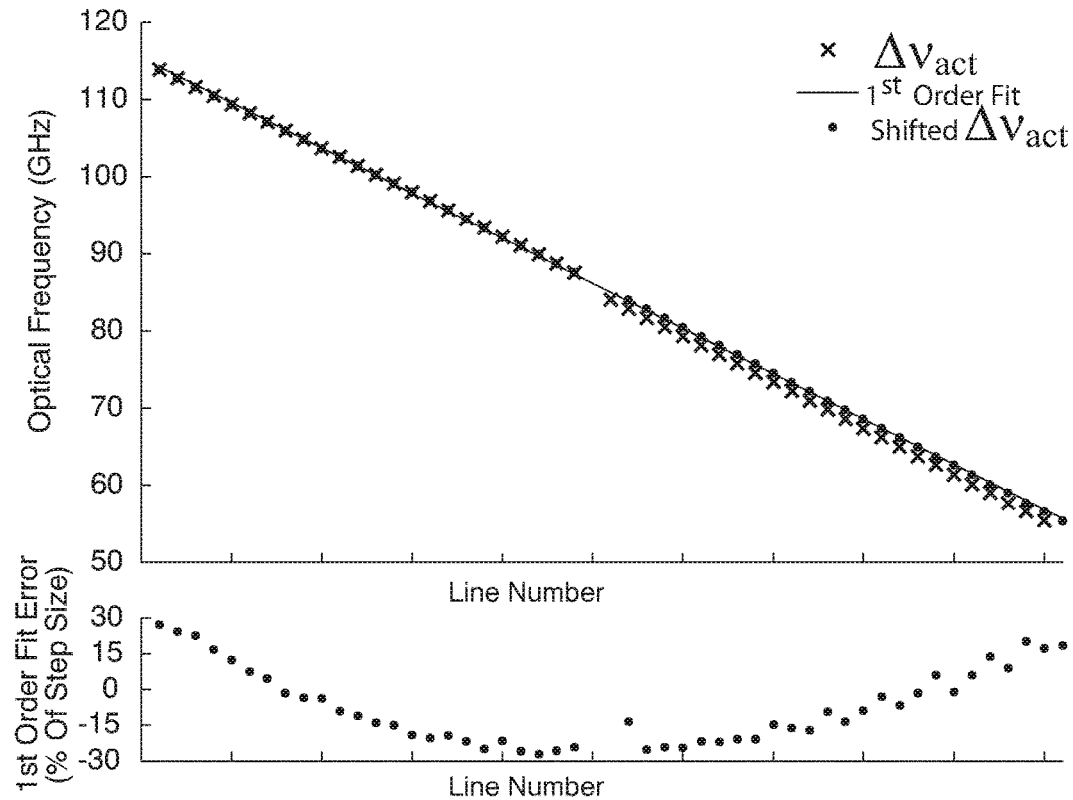
FIG. 12 graphs optical frequency spacing between gas cell absorption lines and a shifted version suitable for use with look-up table indexing (dots in top graph) along with the error between first-order fit to the metric as a percentage of step size to neighboring value.

FIG. 12 shows deltas between absorption line locations, shown as crosses in the figure. By shifting deltas associated with one of the branches (in this case, the R branch of a hydrogen cyanide gas cell), a curve is created by these deltas (shown as dots in the figure), that approximately lies on a straight line (error is shown in the bottom graph of FIG. 12).

A first order fit to this line can be used to map a difference between observed optical frequencies to an absolute absorption line optical frequency. A look-up table (LUT) 70 (i.e., memory space) is programmed with actual absorption line optical frequencies. The actual frequency value for a given observed frequency value can then be indexed from the result of the first-order fit, applied to the identified metric. Depending on the direction of the laser scan, $|\Delta\upsilon_{r7\text{-}r8}|$ can point either to $\upsilon_{R7}$, $\upsilon_{R8}$. It is therefore important to consider the scan direction and adjust the gas cell LUT address accordingly.

Employing this technique, the observed optical frequency accumulator values for adjacent absorption lines can therefore be used to determine the exact (to within tolerances measured by NIST), absolute wavelength of the laser any time an absorption line is traversed. Indeed, every time the laser wavelength traverses a gas cell line, provided it is a nearest neighbor to the one previously crossed, the optical frequency accumulator can be recalibrated, yielding an absolutely accurate wavelength measurement. If more than two gas cell lines are crossed, the slope as well as the offset of the error between actual optical frequency and that stored in the accumulator, can be calculated 75. This slope indicates the ratio of the actual FSR of the wavemeter to the FSR entered into software or firmware. Thus, the slope can be used to precisely calibrate the wavemeter FSR.

Figure 13:
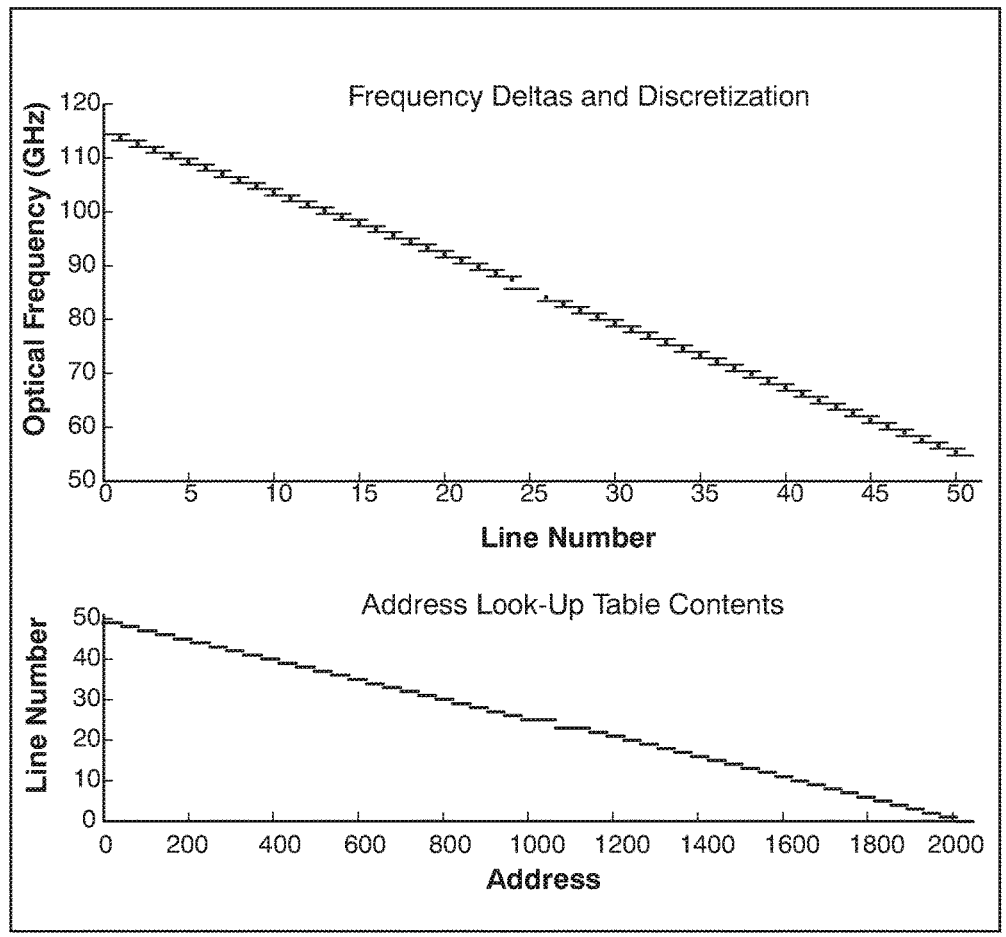
FIG. 13 illustrates an example look-up table method for eliminating the error in FIG. 12 without employing 2nd-order computation.
Figure 14:
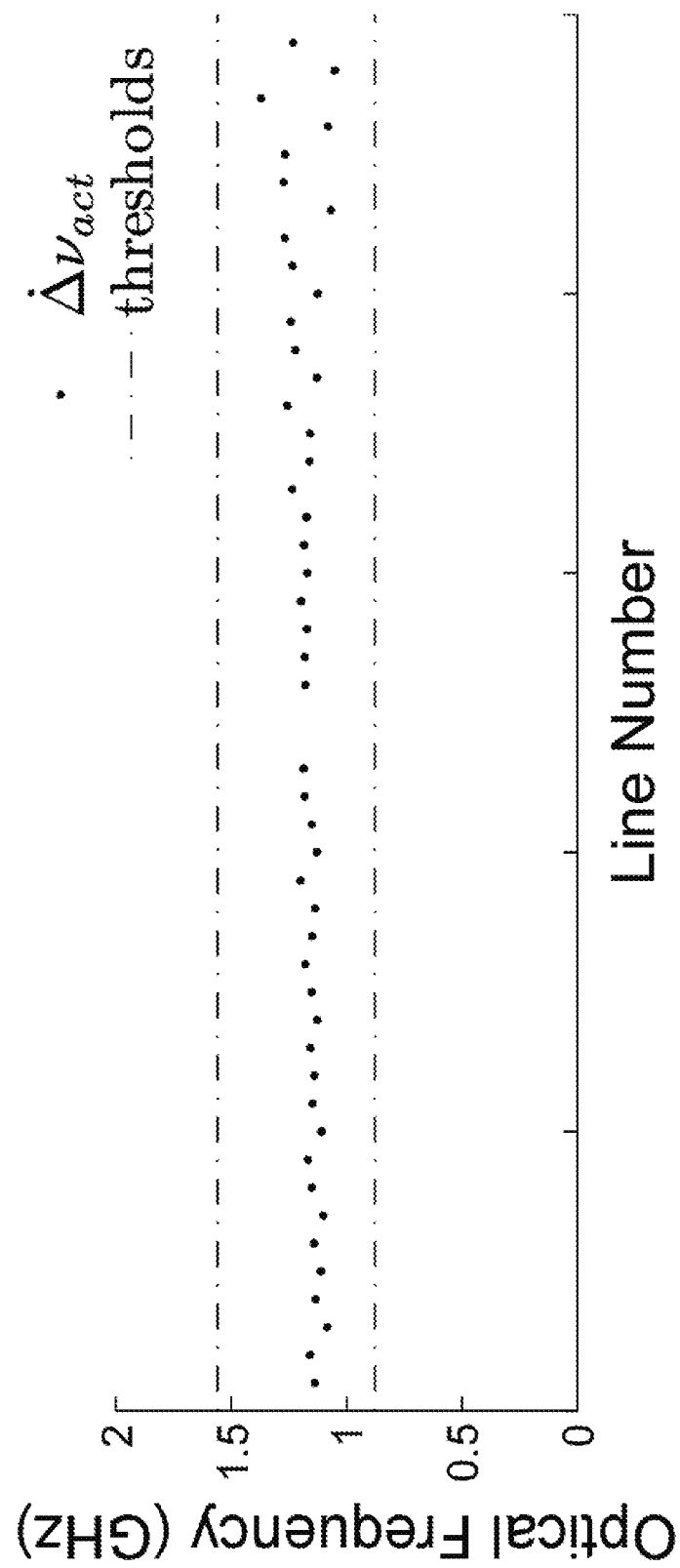
FIG. 14 illustrates an error elimination metric formed by the first derivative of the metric graphed in FIG. 12 along with thresholds.

The error associated with the first-order fit shown at the bottom graph of FIG. 12 may be efficiently removed. Instead of applying a slope and offset to convert frequency deltas to gas cell LUT addresses, the slope and offset can be tailored to address an initial look-up table that contains addresses for a final gas cell LUT. This initial look-up table can be small since the data can be on the order of 8 bits wide, for example, to address the 51 lines of a hydrogen cyanide gas cell. If, for example, the initial look-up table is 2048 points deep, a slope and offset can be found to convert frequency deltas to the 0-2047 address range of the initial look-up table. The vertical extent of the frequency delta values (as shown in the top graph in FIG. 13) can be discretized into 2048 steps, with each address of the initial look-up table containing the appropriate line number. Such a method and look-up table are shown graphically in FIG. 13. This method avoids costly computation of a quadratic conversion between frequency delta and line number, at the cost of using extra memory resources. Discretization into 2048 intervals, as shown in FIG. 13, reduces error (comparable to FIG. 12 bottom graph) to a maximum of ±1.25% (as opposed to ≈±30% without the use of an extra look-up table).

The gas cell absorption line recognition 72 described above is subject to errors, many of which can be recognized and removed using the error elimination block 73 of FIG. 8. Spacings between absorption lines that do not match any lines in the lookup table (too close or too far apart) indicates that an error occurred. It is still possible, however, for an error source to yield a metric that falls within the valid range shown in FIG. 12, yet still be invalid. A useful property of the absorption line metric of FIG. 12 is that its derivative is relatively constant, as shown in 14. This second derivative of observed line frequencies and a thresholding process shown by the dotted lines can be used to identify further potential errors. Detecting a mode-hop through other means could also flag a detected spacing as being potentially in error. Since these line identifications are used to make small corrections of a measurement expected to be highly accurate over the short term, it may be useful to exclude possible erroneous measurements, and wait for another, less suspect measurement. Therefore, such an error detection/removal functionality is preferably incorporated.

Optical path length change due to strain or temperature induced on the wavemeter interferometer will lead to significant wavelength error in the wavemeter output over time; this is referred to as drift. The optical reference calibration block 61 can also be used to eliminate this drift in the error signal. The slope output of the reference calibration algorithm indicates whether the interferometer optical path length (inverse of the FSR) drifted, simultaneously measuring the drift and providing a correction number. As laser wavelength control becomes increasingly more accurate, even small levels of drift, as well as the dispersion of the interferometer, may become important. By sweeping over multiple lines, both the drift and the dispersion of the wavemeter interferometer can be determined and corrected.

Unfortunately, using the gas cell tracking method, drift can only be measured when the laser is sweeping over gas cell lines. Some applications require locking to extremely precise tolerances (<1 pm) over long periods of time; in such applications, gas cell absorption line data are unavailable since the laser is not scanning over such lines. It is possible to remove drift for such applications by passive elimination or measurement/correction of thermal-induced optical path length variation of the wavemeter interferometer. Strain-induced optical path length variation of the wavemeter interferometer can be eliminated by proper hardware implementation. Three non-limiting example methods for eliminating drift include: (1) direct measurement of average wavemeter interferometer temperature and addition of an offset number to counteract the drift, (2) active control of the wavemeter interferometer to a constant temperature, and (3) inclusion of a material with different thermal expansion properties to cancel the thermal effects on the wavemeter interferometer.

First, the interferometer temperature is directly measured. The interferometer exhibits a thermal error coefficient that does not depend on path length mismatch, which error is typically on the order of 10 pm/° C. The error coefficient is accurately measured by thermally cycling the interferometer and observing the change in wavelength for a particular fringe number. A correction number can then be obtained by multiplying the temperature change (with respect to the temperature when the system was calibrated via the reference calibration algorithm above) by the wavemeter thermal error coefficient.

The second method involves controlling the interferometer to a constant temperature, such that there are no thermal-induced path length errors. This solution is particularly appropriate for an interferometer that is written into a photonic integrated circuit. Integrated optical networks typically occupy a relatively small ~0.5"×0.5" area on a thermally-conductive substrate. The substrate can be mounted on a thermo-electric cooler and actively controlled to a constant temperature. Temperature control within tolerances of hundredths or thousandths of a degree Celsius are possible using this technique.

Third, it is possible to bond a portion of one path of the interferometer (typically the longer path) to a material with a different coefficient of thermal expansion from that of the optical fiber. Thus, as the wavemeter is heated or cooled, the fiber bonded to the material takes on the thermal expansion of the material. By proper design, it is possible to build a wavemeter with a negligible thermal error coefficient.

Thus, using a wavelength monitor in conjunction with the above techniques, a digital wavelength measurement can be completed that is directional, continuous, low-latency, exhibits negligible drift, and has extremely fine precision and absolute accuracy. One non-limiting application of this wavelength measurement is in a wavelength-tunable laser control system. An example embodiment was described above in conjunction with FIG. 4. Feedback control attempts to create an error signal proportional to the difference between a desired wavelength setpoint and the actual wavelength output from the laser. Since the wavelength setpoint is assumed to be well known and understood, the characteristics of the laser wavelength match those of the error signal.

A significant benefit to using an interferometer in a tunable laser control system is that the variable being controlled, the optical frequency (inverse of wavelength), is the variable that is directly measured. Unlike applications that employ measurement of actuator position in the laser cavity, there is no issue with linearity or response mismatch between wavelength and actuator position. With such high-precision measurement available, it is possible to close a loop on the system in order to control the laser such that the laser output has wavelength precision similar to that of the wavemeter interferometer.

Figure 15A:
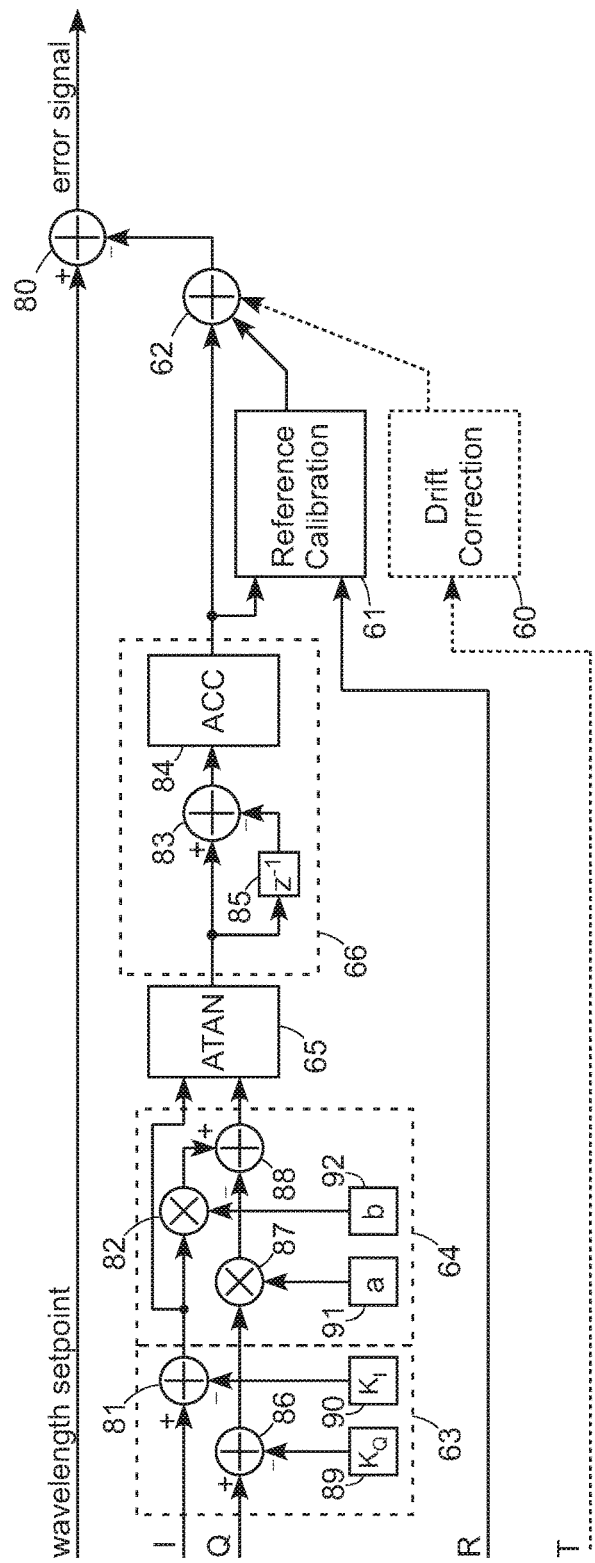
FIGS. 15A and 15B show details of the example wavelength calculation method presented in FIG. 7, calculation of an error signal from the calculated wavelength, and a non-limiting example embodiment of a tunable laser control system with above digital calculation used to control the output wavelength of the laser.
Figure 15B:
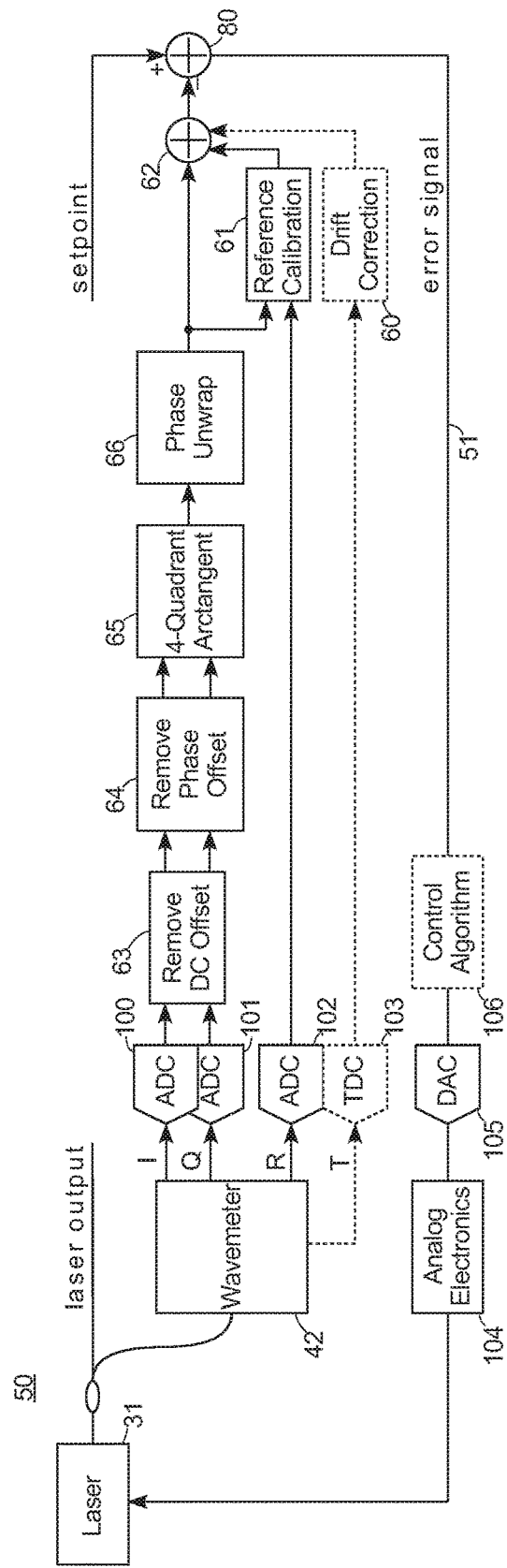

Consider FIGS. 15A and 15B, which show an alternative example embodiment of a digital tunable laser control system. FIG. 15A complements FIG. 7, and shows how the error signal is calculated by employing a subtractor 80 to compare the current wavelength to the wavelength setpoint. If the current wavelength is less than the setpoint, the error signal is positive. Analog and digital hardware are arranged such that a positive error signal is used to drive a laser actuator so that the output wavelength increases. Thus, as the wavelength increases, if it increases past the setpoint, the error signal will go negative, leading to a decrease in wavelength. In this manner, the error signal can be used to ensure that the output wavelength converges to the wavelength setpoint.

FIG. 15A also shows example details of the DC offset 63, phase offset removal 64, and phase unwrapping 66 blocks. The DC offset can be removed via subtractors 81, 86 given knowledge of the offsets K of the I and Q signals 89, 90. The phase offset can be removed via two multipliers 82, 87 and a subtractor 88 via constants a 91 and b 92. The constants a and b can be given by knowledge of the amplitudes of the I and Q signals and the phase offset between the two. The phase unwrapping 66 can be accomplished via a derivative (e.g., using delay block 85 and subtractor 83) and an accumulator 84.

FIG. 15B complements FIG. 4, and shows example details of the electronics block used to calculate laser wavelength and an appropriate error signal. The digital wavelength number and setpoint in the figure are in units of FSR of the wavemeter interferometer. By taking this FSR into account, an appropriate setpoint can be calculated based on a particular laser wavelength or a set (waveform) of wavelengths.

The T signal is the wavemeter temperature, and the TDC component 103 is a temperature to digital converter. These components (as well as 60) are required only if the wavemeter interferometer temperature measurement approach to drift correction as described above is utilized. The analog electronics block 104 includes such components as amplifiers, voltage-current converters, filters, etc. that filter the DAC 105 output and transform its range to the input range of the actuator of interest. Particular attention must be paid to digital-analog conversion 105 and analog signal conditioning 104 such that as much of the dynamic range of the error signal be utilized as possible or practical. This will be discussed in more detail below. The error signal can be used to directly drive the DAC, or a controls algorithm 106 can be used to convert the error signal into an appropriate control signal. Techniques employed for such a controls algorithm are well understood under the umbrella of control systems theory and are beyond the scope of this document.

From a control systems standpoint, latency (i.e. delay through various components of a feedback loop) is a very important parameter. As latency increases, feedback loop bandwidth decreases. In other words, the longer it takes for a system to recognize and correct for an error, the more time the laser has to accumulate error before it is corrected, and only error components at lower frequencies can be eliminated. The largest latency component when employing the digital scheme shown in the controls system of FIG. 15B is actually in conversion of digital signals to their analog representations. To put this in perspective, analog-digital conversion of the wavemeter signals takes ~10 ns. Calculation of the error signal according to FIG. 7 typically takes ~1 µs. However, conversion from digital to analog representation, while sufficiently suppressing noise, can take ~100 µs. Thus, it is advantageous, if possible, to keep the feedback loop entirely in analog electronics.

Figure 16A:
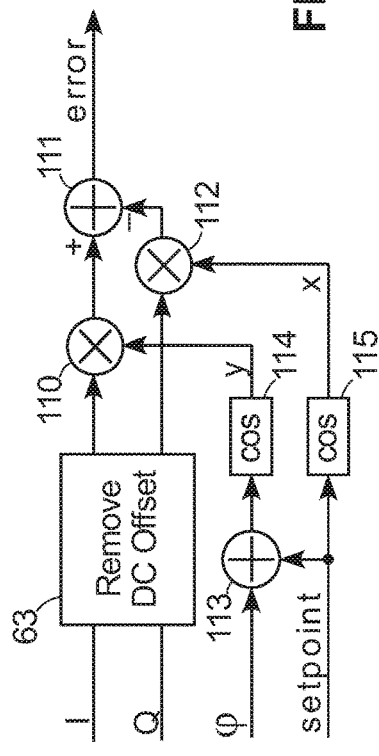
FIGS. 16A and 16B show, respectively, a non-limiting example embodiment for calculation of a low-latency error signal from wavemeter I and Q signals and a wavelength setpoint, and a non-limiting example embodiment of an analog feedback circuit for controlling the wavelength generated by a tunable laser.

A non-limiting example embodiment shown in FIG. 16A for calculating an error signal is appropriate both for digital or analog electronics. Since it can be fully implemented in analog electronics, this embodiment allows for extremely low latency feedback control. Since each point on the ellipse shown in FIG. 6 corresponds to a particular wavelength of the laser (although not uniquely since the point revolves around the ellipse hundreds or thousands of times over the full tuning range of the laser), it is possible to calculate quadrature setpoints x and y that correspond to a particular set of I and Q values for a particular wavelength. The x and y signals may be determined using an adder 113 and cosine operations 114, 115 as follows:

$$x = \cos(\theta_o)$$

$$y = \cos(\theta_o + \phi_o),$$

where $\theta_o$ is the wavemeter phase setpoint (proportional to optical frequency setpoint). After removal of the DC offset 63 from the I and Q signals, an error signal that can be used in a very high-speed feedback loop can then be calculated using multipliers 110, 112 and a subtractor 111 as follows:

$$e(t) = yI - xQ \propto \sin(\theta(t) - \theta_o)$$

Figure 17:
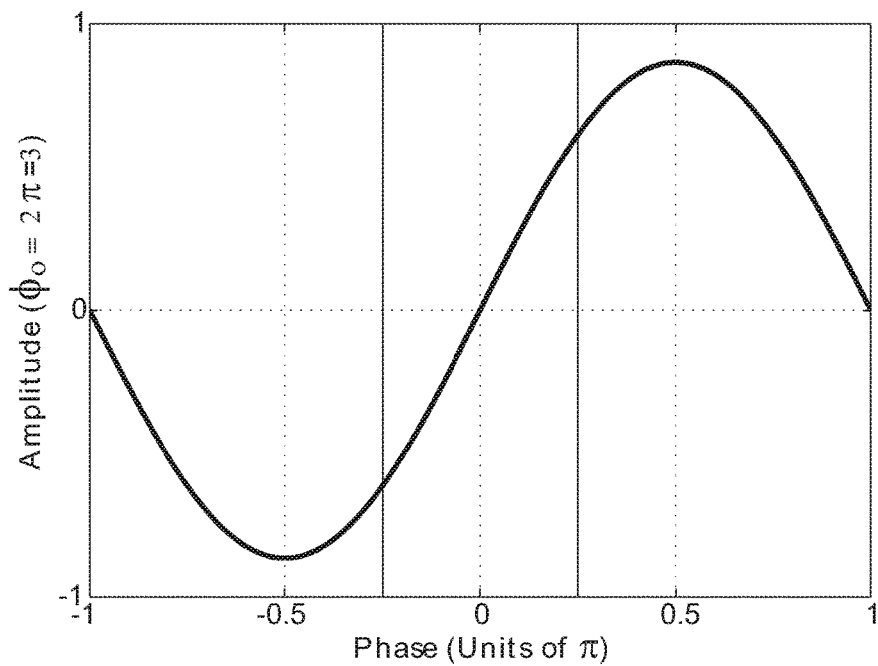
FIG. 17 shows the relationship of the low-latency error signal in FIG. 16A to wavelength setpoint.

A graph of this error signal in shown in FIG. 17. As long as the current wavemeter phase is within roughly π/4 radians of the setpoint, the error signal is approximately linear in optical frequency. The error signal in the above equation can be calculated entirely in analog electronics. It is important when closing a feedback loop around the error signal that the wavemeter FSR is carefully chosen. Since the error signal is linear over approximately one fourth of the FSR, the FSR should be chosen to be at least four times the optical frequency noise of the laser source when the laser is in open-loop operation (i.e., not under feedback control).

The x and y signals are preferably computed digitally. The cosine blocks can be implemented via look-up tables or a CORDIC processor. Digital-analog converters (e.g., FIG. 16B 121, 124) convert the digital representation to analog signals. The latency involved in calculation or conversion of digital x, y signals to their analog equivalents does not figure into the feedback loop latency, however, because they are not in the feedback loop. Rather, the x, y signals form the setpoint for the feedback loop.

Figure 16B:
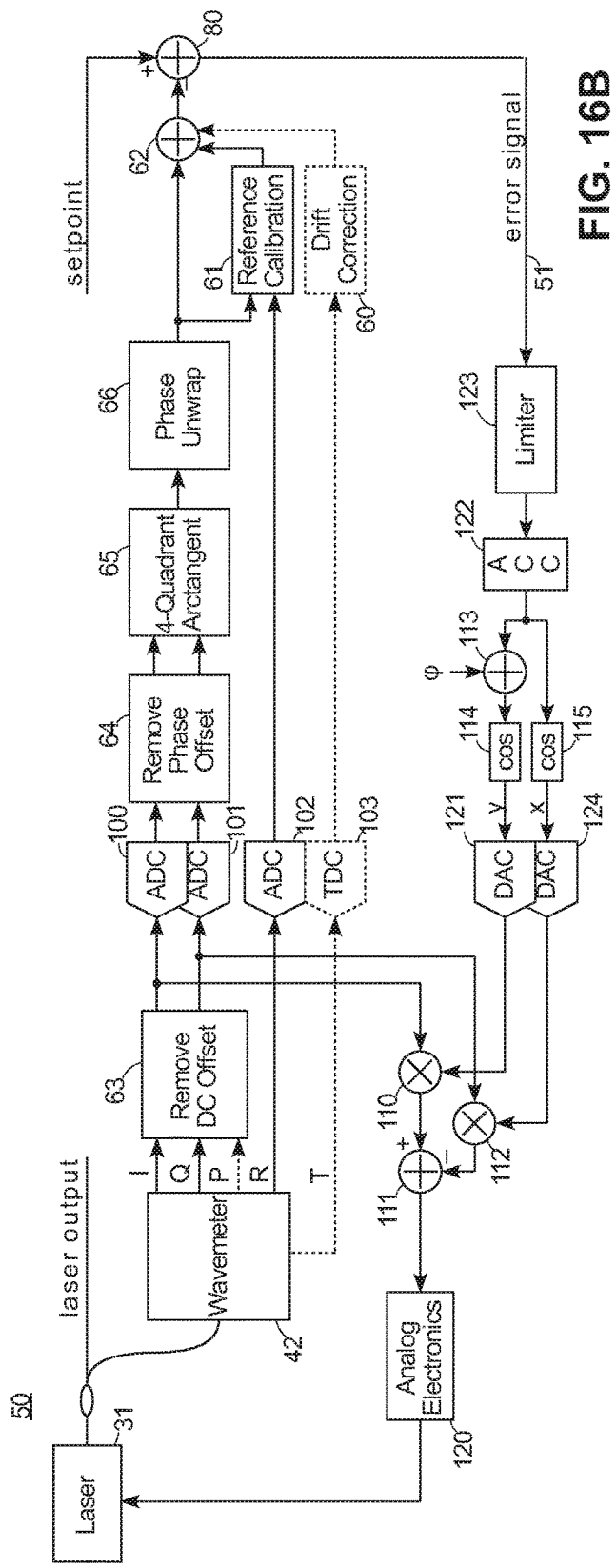

FIG. 16B shows a diagram of a complete control system based on this fast analog feedback loop. The feedback loop in the figure begins at the laser 31 and traverses the following: wavemeter 42, DC offset removal (implemented in analog electronics) 63, analog multipliers 110, 112, analog subtractor 111, and other appropriate analog electronics 120 (for scaling, etc.). Because the feedback loop is completely in the analog domain, the latency is entirely determined by only the time of flight down the wavemeter interferometer, the latency in opto-electronic conversion, and the latency in analog amplifiers.

Outside of the feedback control loop, the digital components of the wavelength measurement hereinbefore described apply to this control scheme. The wavelength is measured and compared to a setpoint to generate an error signal. In this example, a limiter block 123 is added to limit the error signal to a rate at which the analog feedback loop can close. At a maximum, this rate can be no more than one fourth the FSR of the wavemeter interferometer per clock cycle of the digital electronics in which the algorithm is implemented. This corresponds to one fourth of one revolution around the I-Q ellipse. Any larger discrete step would cause ambiguity in the fringe to which lock is achieved. In practice, the limiter value is preferably smaller than FSR/4. For example, it may be kept below or on the order of the wavemeter precision such that the final result is a smooth sweep in wavelength. The accumulator 122 contains only fractional bits and wraps over a range corresponding to $-\pi$ to $\pi$.

To further describe the operation of the limiter 123 and accumulator 122 blocks which operate on the error signal, consider that the laser has been permitted to lock to a particular wavelength, and the setpoint is instantaneously moved B Hz (optical frequency) to a new wavelength setpoint. In order for the laser to achieve the new setpoint, the x and y signals must smoothly traverse the I-Q ellipse B/FSR times. Suppose that the limiter block limits the error signal to a maximum of FSR/8 Hz. On each clock cycle, the angle accumulator increments by ⅛ a revolution of the I-Q ellipse. In this case, it will take 8B/FSR clock cycles to achieve the setpoint. Once the setpoint is achieved, the error signal will go negative by a small amount, likely less than FSR/8, the accumulator will decrease by a proportional amount, and the system will stabilize at the new setpoint.

This non-limiting example embodiment in FIG. 16B provides for very high bandwidth laser control, while allowing for flexibility afforded by digital electronics in formulation of wavelength setpoint. Wavelength setpoint waveforms of various kinds can be devised and output so long as they are slow enough for the digital electronics to move the x, y setpoints (meaning they traverse the I-Q ellipse slow enough such that the feedback loop can track to the x, y setpoint). Since clock frequencies and digital-analog converters operate at frequencies on the order of tens of hundreds of MHz, very fast sweeping can be obtained.

As mentioned above, latency is determined by both the longest time of flight of the optical field down the wavemeter interferometer fibers, and by the bandwidth of the analog components used to create the error signal and apply the error signal appropriately to laser actuators. As such, latency using this embodiment can be ~10 ns, enabling feedback control with bandwidth out to hundreds of MHz. At these bandwidths, the optical delay through the optical fiber that guides the light from the laser to the detectors becomes significant, so those fiber lengths are preferably kept short. For example, at a 50 MHz feedback control loop bandwidth, delays that are significant with respect to 20 ns are important. Suppose only 2 ns of optical delay is desired in this example. Given that light in fiber accumulates 1 ns of delay every 20 cm, the longest fiber path length to the I and Q detectors must be less than 40 cm.

Figure 18:
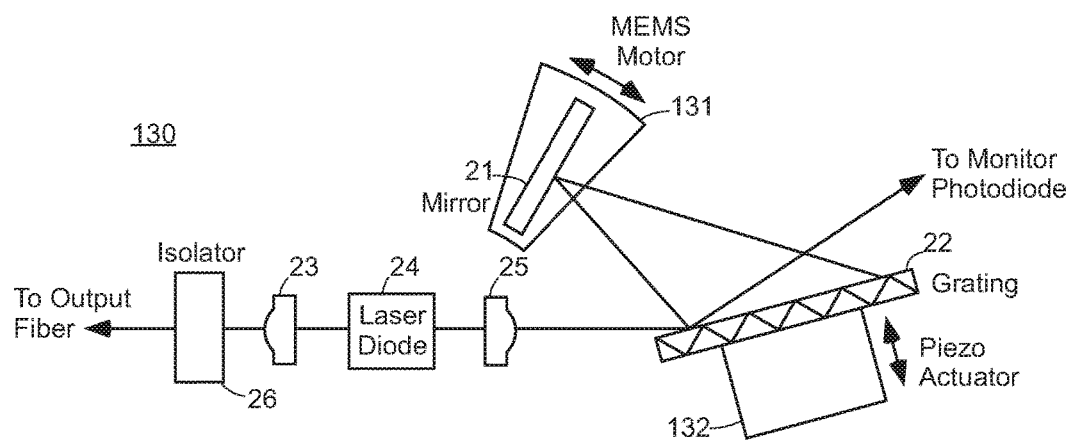
FIG. 18 shows components of a particular external cavity laser.

A hybrid control system may be constructed where the analog controls are used for a high-frequency regime, and digital controls are used for a complementary low-frequency regime. Such an arrangement may be useful in cases where separate actuators are used to effect a response in the output wavelength of the laser, or when passive noise reduction at high frequencies is desired. A non-limiting example of such a laser is Luna Technologies' Phoenix 1000 laser, a diagram of which is shown in FIG. 18. In this laser 130, a MEMS motor 131 is used to rotate the cavity mirror 21, a piezoelectric transducer 132 is used to adjust the position of a wavelength selective grating 22, and a laser diode 21 is used to control the output power. The MEMS motor has a very high magnitude wavelength (~100 GHz/V) response out to approximately 600 Hz. The piezo transducer has a relatively low magnitude wavelength response (~0.1 GHz/V) out to hundreds of kHz. In addition, the laser diode also has a low magnitude wavelength response (~0.1 GHz/mA) out to hundreds of MHz.

Various environmental and physical effects serve to perturb the laser wavelength. For example, small external acoustic signals in the low audio frequency range can perturb the mirror, thereby effecting a wavelength change. In a high-frequency example, rapid changes in the electron density the in the diode gain medium cause small, high-frequency variations in the laser wavelength. One way to correct this acoustic perturbation is to change the voltage on the mirror controls to counteract the external force. However, if the frequency of the perturbation is higher in frequency than the mirror response, the mirror will not be able to remove the effect. Thus, a combination of actuators can be used to eliminate wavelength errors. For example, with relatively low-frequency audio perturbations (>~100 Hz), the digital technique illustrated in FIG. 15B may be used to create a low-frequency corrective MEMS motor signal, and employ a variant of the technique shown in FIG. 16A may be used to create a high-frequency corrective piezo transducer signal.

Figure 19:
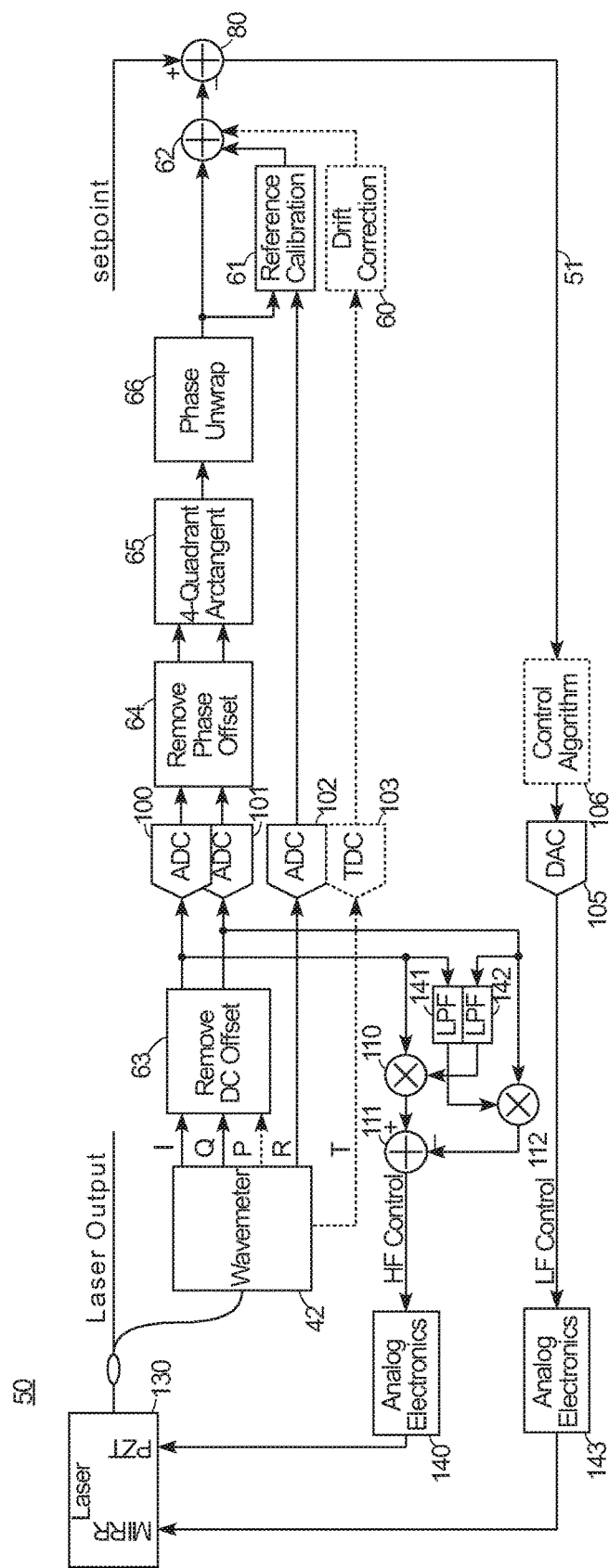
FIG. 19 shows another non-limiting example embodiment of a feedback circuit for controlling the wavelength generated by a tunable laser in which a low-frequency feedback control loop is used to control a low-frequency response, high-magnitude response actuator, combined with a high-frequency (low-latency) feedback loop used to control a high-frequency response, low magnitude response actuator.

A non-limiting example of such a dual laser actuator control system is shown in FIG. 19. This figure shows a complete controls system in which a digital feedback branch and an analog feedback branch are employed together. The digital branch includes all blocks to the right of the ADCs (100, 101, 102) and DAC (105); its low-frequency error control signal is used to drive the mirror (MIRR) 131. The analog branch is an inner loop with multipliers 110-112 and low-pass filters (LPF) 141, 142; this AC-coupled (that is, it has no offset), high-frequency signal is used to drive the piezo transducer (PZT) 132. The analog low-pass filters in the analog, high-frequency loop are configured to act as time-varying setpoints akin to the x, y setpoints described above. The low-pass filter cutoffs should match the response cutoff of the mirror actuator. In this manner, the mirror can be used for slow, absolute wavelength control, while the piezo transducer is used to remove high-frequency wavelength noise. The high-frequency loop acts in a completely passive fashion, requiring no inputs once properly configured. The high-frequency error signal may also be connected to the laser diode instead of the piezo transducer, to potentially remove even higher frequency wavelength noise.

Of particular importance when employing an error signal with such high dynamic range is preserving that dynamic range such that the signal reaching the actuator is of high enough fidelity to ensure removal of measured wavelength errors and to avoid additional errors due to added noise on the control signal. Dynamic range on the error signal on the order of 160 dB is typical using the above described wavelength monitor 42 in conjunction with a laser that tunes over a range of 10 s of nm. To the knowledge of the inventors, this dynamic range is well beyond the capabilities of analog electrical systems. Indeed, achieving performance beyond 100 dB in an electrically noisy environment is difficult. Multiple approaches can be taken to utilizing the incredible dynamic range of the error signal. For example, one actuator of the laser may be used, and the performance window pushed as far as practicable (perhaps achieving a maximum dynamic range on the order of 100 dB). If available, one can use multiple actuators, one actuator with a strong wavelength response, and another with a relatively weak response, to achieve control over the full dynamic range of the error signal. This second approach builds upon the first approach, since relatively high dynamic range will be required of one or both actuator signal paths.

When attempting to push dynamic range performance as far as possible, the type of DACs (typically having 16 bits or less) ordinarily used in control systems cannot be used since they do not exhibit sufficient dynamic range. Of particular concern is faithful conversion from the digital domain to the analog domain without introduction of noise of a sufficient magnitude to corrupt the control signal Consider as an example a 16-bit DAC used to directly drive the primary actuator (that with the highest wavelength response) of a laser. The maximum dynamic range of an n-bit DAC is given by the formula 1.76+6.02 n. Thus, a 16-bit DAC can exhibit, at the highest, a 98 dB dynamic range. Using as an example the Phoenix 1000 laser, which exhibits a tuning range of 66 nm over the full range of the MEMS motor actuator input, each least-significant bit (LSB) code change of the 16-bit DAC could be expected to effect a change in output optical frequency of approximately 100 MHz. In such a situation, attempting to lock to an arbitrary wavelength setpoint waveform would result in 100 MHz discrete jumps.

Such an example is shown in FIGS. 20 A, B, and C. In this example, an arbitrary wavelength setpoint waveform is defined as shown by the bold line in FIG. 20B. In this case, the setpoint waveform is extremely fine; it varies over only a couple hundred MHz. FIG. 20A shows the DAC code waveform used in order that the output wavelength comes as close as possible to the setpoint waveform. The effect of this DAC code waveform is shown as the thin line in FIG. 20B. Here, a low-pass filter has been used to simulate the response of the electronics and actuator in the feedback loop; thus, the wavelength output is continuous and exhibits a delay with respect to the input. FIG. 20C shows the difference between setpoint and actual wavelength. Discrete steps of approximately 100 MHz are evident due to the limited dynamic range of the 16-bit DAC. In a laser sweeping scenario, the wavelength evolution would exhibit a stair step pattern with minimum "height" of each stair roughly equivalent to 100 MHz.

A relationship exists between smoothness of the output laser sweep, the speed of the sweep, DAC resolution, DAC sample rate, and response cutoff frequency of electronics and the actuator of interest. All other factors being equal, a decrease in cutoff frequency of the system response (for example, via a low-pass filter between DAC and actuator) will lead to a smoother wavelength output, but will also lead to a greater delay between application of an input and change in output wavelength of the laser; such a decrease will also lead to a decrease in maximum sweep speed that can be supported by the control hardware. It will suffice to point out that, for most applications, using a typical resolution DAC of about 16 bits of less will place constraints on the control system such that high-precision, high-accuracy, wide sweep range, and a wide range of sweep speeds cannot be simultaneously be supported.

One way to overcome the limitations of a typical-resolution DAC is to use an analog integrator between the DAC and actuator, e.g., in the analog electronics block 143 in FIG. 19. An analog integrator allows for absolute control of laser wavelength over an arbitrary range, since the DAC then controls the slope of the output waveform instead of its absolute value. In this implementation, given appropriate balancing of DAC sample rate and supported sweep speeds, the dynamic range using an analog integrator is on the order of the output noise of the amplifier used to create the integrator. Thus, the dynamic range in this case can be on the order of 110-120 dB.

A complementary example to that of FIG. 20 for this 16-bit DAC plus analog integrator example embodiment is shown in FIG. 21. The bold line in FIG. 21B shows the same setpoint waveform as shown in FIG. 20. The maximum tuning speed supported by the DAC was arbitrarily set at ±20,000 nm/s. Thus, an LSB of the DAC corresponded to approximately a 77 GHz/s (0.61 nm/s) scan rate; the sample rate of the DAC was 20 kHz. This wide range of scan speeds was chosen to show the utility of this approach, and also to aid in viewing the effects of the integrator in the figure. Ultimately, however, the example shows a very coarse output; much better results can be achieved with a narrower range of scan speeds or increased sample rate. Indeed, sample rates up to several tens of MHz is possible with such a DAC. FIG. 21A shows the DAC output codes as a function of time, with the 20 kHz sample rate evident. The thin line of FIG. 21B shows the simulated response of the laser to the integrated DAC output. While it appears to be very smooth, this output is actually only piecewise continuous. FIG. 21C shows the difference between the setpoint waveform and actual wavelength output. Notice the scalloped pattern to this graph; this first-order example shows the difference between the continuous setpoint waveform and piecewise continuous control signal.

FIGS. 21A-21C show an important feature of feedback control that the output wavelength waveform suffers adverse consequences due to the latency of the feedback loop. In this particular case, the latency is approximately equivalent to the inverse of the DAC sample rate. Typically, the latency will primarily be determined by the integrator time constant or the response of the wavelength actuator. For the example of FIGS. 20A-20C, a decrease in latency will only marginally improve the result shown, while in the case of the analog integrator example in FIGS. 21A-21C, the error reduces proportionally to the decrease in latency. Of course, the magnitude of the error in such a case is a function of the setpoint waveform itself.

The example shown in FIGS. 21A-21C was actually chosen to yield a coarse output signal. By increasing the sample rate of the DAC beyond the low-pass cutoff of the electronics and/or actuator response, the output wavelength response will be continuous. Note the difference in error between actual and setpoint wavelength in FIG. 21C versus FIG. 20C. Increasing the DAC sample rate in the FIG. 20 example will yield virtually the same result, whereas a similar increase in the integrator example (up to approximately the inverse of the feedback loop delay) will decrease the error by a factor proportional to the increase. Indeed, an inverse relationship exists between DAC sampling rate and required number of bits to achieve a particular error magnitude. A logical extension of this relationship reveals that even a 1-bit DAC can be used to achieve wide dynamic range, quasi-continuous output signal, so long as it is operating at a very high sample rate. Indeed, if the sample rate is greater than the low-pass cutoff frequency of the electronics and actuator response, the signal will yield a continuous output wavelength response.

Incorporation of an analog integrator comes at the cost of introduction of a single-pole, low-pass filter response imparted by the integrator. This may limit its applications to relatively low frequencies (several kHz or tens of kHz), or, at high frequencies, to low magnitudes (as the single pole imparts a −20 dB per decade response in the frequency domain). In addition, since the output voltage or current is not absolutely controlled, the design may need to provide for a hardware integrator reset.

DACs typically used in control systems include the R-2R, binary-weighted, thermometer, and segmented types. These DACs are well characterized to operational frequencies down to DC (0 Hz). However, these DACs typically do not achieve SNR greater than ~90 dB. In addition, they typically exhibit a great deal of high-frequency glitch noise, evident whenever the DAC code is changed. This glitch noise is spread over a relatively wide frequency range such that low-pass filtering with cutoff frequencies many times lower than the sampling rate must be employed. Low-glitch DAC designs are available, which, when combined with proper filtering, yield an acceptable solution in some situations (indeed, these prove to yield better performance in conjunction with the analog integrator approach outlined above). In order to achieve performance greater than 100 dB with an absolute DAC signal (as opposed to the integrator combination, in which only the derivative can be controlled), another type of DAC—a delta-sigma DAC, can be used. Delta-sigma DACs operate on much the same principle as that described above with the integrator approach: a low resolution (typically 1-bit) DAC operates at very high speed, but in this case it operates in a negative feedback configuration. This serves to create extremely smooth signals at low frequency (typically in the audio range), at the expense of pushing noise into high frequencies (approximately 96 kHz, or, in the case of an interpolating delta-sigma DAC, 384 kHz or beyond). A simple loop filter in the feedback loop of the delta-sigma DAC accomplishes this noise shaping—or relocation of noise into a predictable high-frequency location. Delta-sigma DACs require either internal or external low-pass filtering to remove this out-of-band (typically 96 kHz or 384 kHz) noise. As such, they cannot be used for high sample rate (~MHz) operation. Typically, delta-sigma DACs are used in audio applications, and are specified only for operation over audio frequencies (20 Hz-20 KHz); their characteristics at very low frequencies (0-20 Hz) are typically not documented. When used in a feedback loop, however, the feedback loop can remove drift and slow nonlinearities. An important advantage with audio DACs is their exceptional dynamic range performance, which can reach beyond 110 dB.

Despite this advantage, delta-sigma DACs are rarely used in feedback control since most of them incorporate high-pass filters to remove 0-20 Hz "noise". There exist, however, a small class of delta-sigma converters that omit the high-pass filter, or are programmable such that the high-pass filter can be removed. Consider the example in FIG. 15B which uses a delta-sigma converter for DAC 105. In this case, the analog electronics block 104 includes analog low-pass filters designed specifically to remove out-of-band noise in the converter output. Multi-pole filters (typically 3 poles or greater) are used to impart much steeper rejection of −60 dB per decade or greater. Provided the low-pass filter cutoff frequency significantly exceeds (several times greater) the cutoff frequency in the response of the wavelength actuator, the filter contributes only negligibly to feedback loop delay. A significant advantage to employing a delta-sigma DAC in a laser controls system is that absolute control obtained. Even though the DC offset corresponding to a particular DAC code will drift with time and environmental parameters, a 24-bit DAC, for example, is absolutely accurate to approximately 18 bits.

As mentioned above and shown in FIG. 19, it is possible to achieve the full dynamic range of the error signal when using multiple actuators each having a differing magnitude of wavelength response. In the Phoenix 1000 laser, for example, the mirror exhibits a wavelength to input voltage response of 100 GHz/V, while the piezo-electric transducer effects a 0.3 GHz/V response. Given the approximate equal input voltage range of the two actuator input signals, the PZT response lies at approximately −50 dB relative to the mirror response. The laser diode wavelength response (85 MHz/V) lies at approximately −60 dB relative to the mirror response. Given that the signal conditioning electronics in the mirror control path can achieve ~100 dB SNR, another actuator with modest performance (in this case, approximately 60 dB SNR) can be used to take full advantage of the error signal dynamic range. In order for the two actuators to work in harmony, the frequency range of the error signal may be split among the two actuators—the low-frequency and high-frequency signals being routed to the more responsive (MEMS motor) and less responsive (PZT or laser diode) actuators, respectively. This scenario is shown in FIG. 19, where a low-frequency signal is sent to the MEMS motor and a high-frequency signal is sent to the PZT. In this example, the "LF Control" signal could actually contain high frequency information, but the high frequencies would be filtered by the low-frequency response of the MEMS motor. The low-pass filters in the low-latency feedback loop are designed to approximately match the mirror response; the high-frequency control signal thus is devoid of these low-frequency components, which were sent to the mirror. In this example, a delta-sigma DAC could be employed to achieve SNR on the order of 100 dB. SNR requirements on the PZT low-latency analog control loop would then lie only at approximately 60 dB. Thus, a typical-resolution DAC could be used for the PZT signal path, e.g., a 10-bit or 12-bit DAC. Other embodiments are possible.

An arrangement similar to that shown in FIG. 15B or FIG. 16B to accomplish multi-actuator control. In the control algorithm block 104 or analog electronics block 120, a digital or analog state variable filter (a filter which simultaneously outputs low-pass, high-pass and band-pass responses) may be used to achieve matched low- and high-frequency response outputs given the single input error signal. These two frequency-separated signals could then (with or without additional signal conditioning circuitry) be routed to high- and low-magnitude response actuators. Using an arrangement like that in FIG. 15B with digital filter and two DACs, the inventors have achieved control down to ±1 MHz in optical frequency. Given the range of the tunable laser employed, this amounts to an approximate 132 dB dynamic range. This was achieved with a relatively high-latency, completely digital feedback loop with a loop bandwidth of only a few kHz. By employing the low-latency analog loop shown in FIG. 15B, much tighter control can be achieved.

The laser wavelength control approaches described above are all causal. That is, it is assumed that the control system can only respond to measurement of the actual laser wavelengths that occurred in the past. This is a reasonable assumption under many circumstances. There is, however, a class of problems where information about the future is needed, e.g., the case of a laser system that is driven by a cyclic waveform. Once the cyclic waveform is applied to the laser system for some period of time, e.g., on the order of ten times the time constant of the laser system, the system response settles to a repeatable state. In this case, the drive and the response can be assumed to be known into the past and the future (because of the repetitive nature of the signal), and thus, more effective acausal control theory can be used.

The assumption that a system has a steady-state response only requires an assumption of time invariance, (e.g., the system remains the same during the period of control); no assumption about linearity of the system is required. This is important because many available drive mechanisms tend to be nonlinear. By using the steady-state assumption, the laser response may be broken down into a set of Fourier components. For example, for a system that is to achieve a 100 Hz tuning waveform, controlled by actuator signals having a 50 kHz update rate, there are 250 frequency components, each with a phase and amplitude, giving 500 degrees of freedom in the control signal.

FIGS. 22A and 22B show the frequency response (magnitude and phase) of a mirror actuator used in an example laser. There is a strong resonance around 500 Hz, with a corresponding phase inversion. If a drive waveform is to be calculated at these higher frequencies, the phase shift as a function of frequency must be properly taken into account.

Figure 23A:
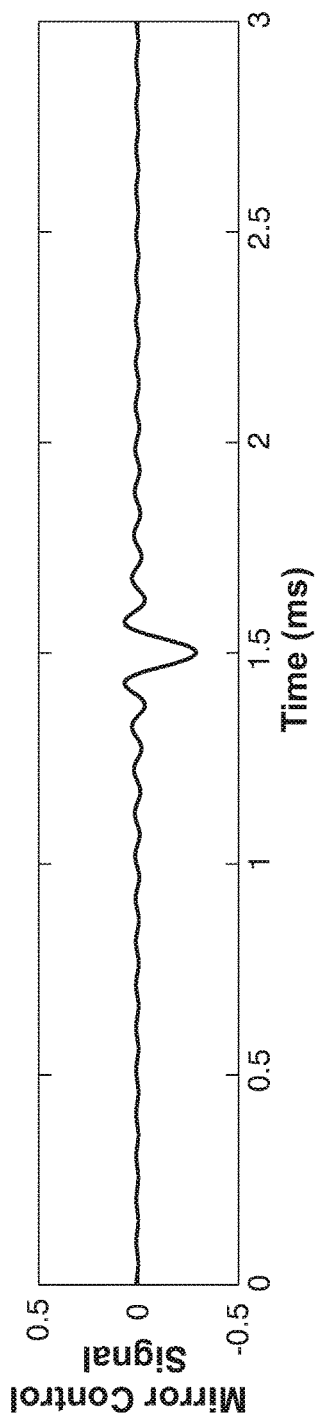
FIGS. 23A-23C show an example repetitive input function for measurement of mirror transfer function including mirror control signal, calculated CW and CCW signals, and frequency-domain graphs, respectively.
Figure 23B:
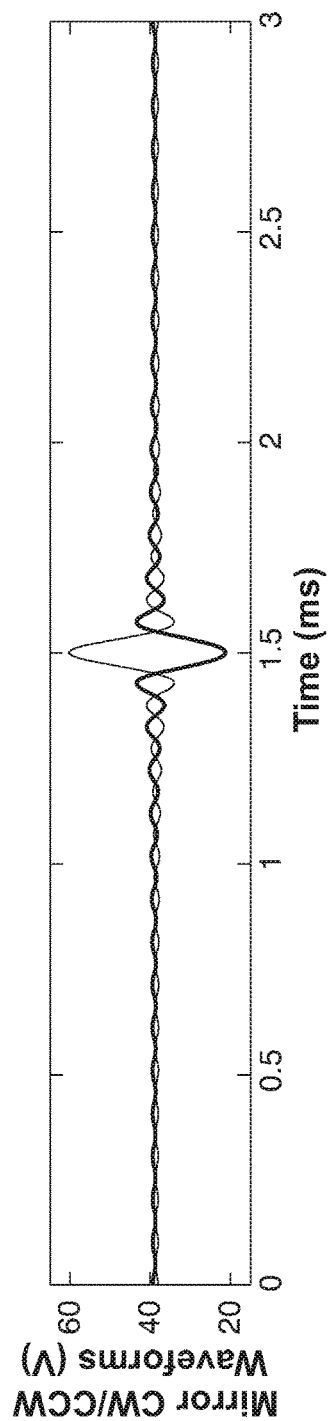
Figure 23C:
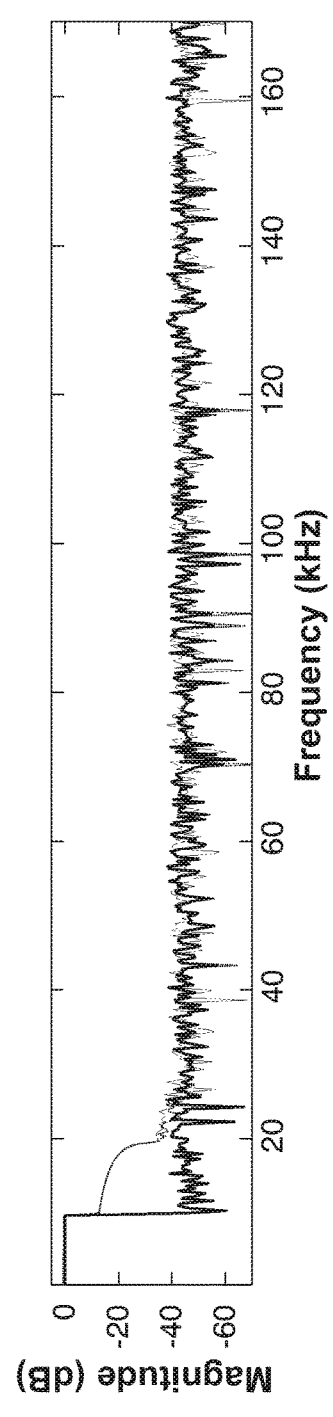
Figure 24:
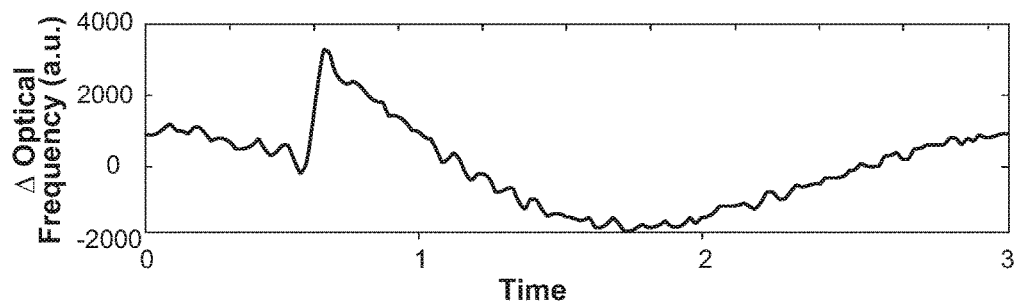
FIG. 24 is the time-domain response of scan speed to the repetitive input function shown in FIGS. 23A-23C.
Figure 25A:
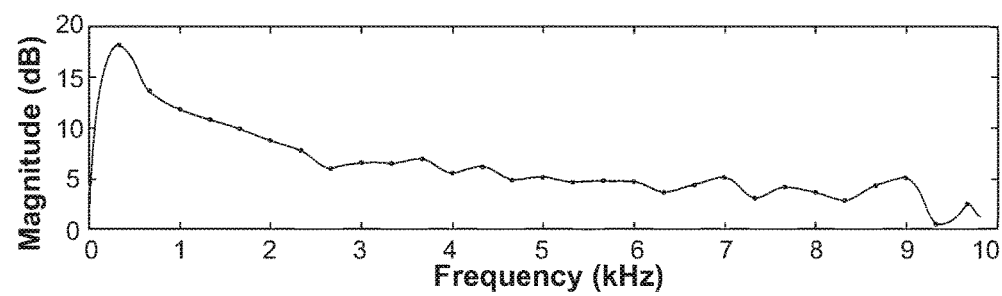
FIGS. 25A and 25B show magnitude and phase response of scan speed to the repetitive input function shown in FIGS. 23A-23C.
Figure 25B:
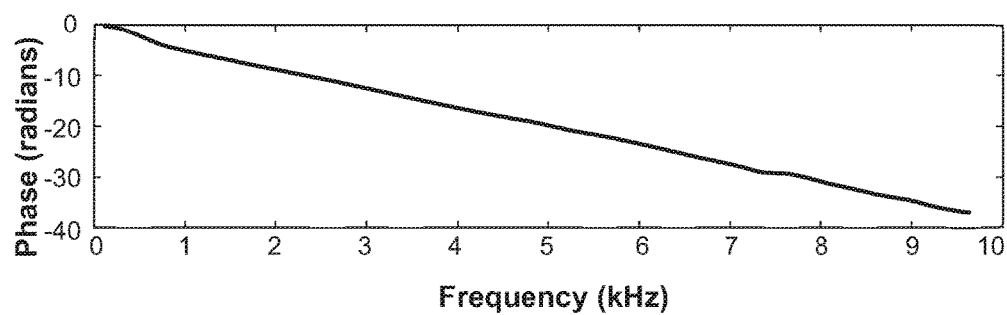

A first step in calculation of the drive signal is to determine the transfer function of the mirror actuator, for example, the transfer function of output wavelength tuning rate to input control signal. In this case, the steady-state transfer function for a repetitive impulse is desired rather that the single impulse response shown in FIGS. 22A and 22B. The frequency content of the impulse is restricted to only those frequencies desired to control the system because there are high-frequency mechanical resonances that are difficult to control, and preferably are not excited. A further complication in this non-limiting example application is that the controls are differential, and so two signals must be produced to control the mirror actuator. The initial control signal, the differential control signals, and their frequency content are shown in FIGS. 23A-23C. The two differential control signals are used to drive the mirror. These are repetitively applied, and the steady state response of the mirror is recorded. The time-domain response of the laser to the signals shown in FIGS. 23A-23C is shown in FIG. 24. The frequency-domain response is shown in FIG. 25.

Using this transfer function, an initial guess at the drive waveform required to produce some target waveform may be calculated. Often, linear tuning is desired so that interferometric signals from a particular delay have a constant frequency, or at least remain confined to some narrow range of frequencies. Therefore, demonstrated here is determination of a control waveform that generates a triangular laser wavelength scan with parabolic transitions at the peak and trough.

From the initial transfer function, $H(\omega)$, an initial mirror waveform guess is calculated and output. In this case, the above functions take the form:

$$f(t) = F^{-1}\left\{\frac{N(\omega)}{H(\omega)}\right\}$$

where $N(\omega)$ is the Fourier transform of the desired optical frequency waveform $v_{des}(t)$ which is shown with the thick line in the top two graphs in FIGS. 26A and 26B. Because the system is nonlinear, the actual resulting response of the system $v_{obs}(t)$ to this drive voltage, shown with the thin line in FIGS. 26A and 26B, is substantially different from the desired wavelength curves. FIG. 26C shows the calculated differential control signals that generated the response shown in FIGS. 26A and 26B.

The original guess is modified by a successive approximation loop with knowledge of the transfer function and the error between desired and actual wavelength. In an example, non-limiting implementation, the equation is given as:

$$f_{new}(t) = f_{old}(t) + \gamma \cdot F^{-1}\left\{\frac{F\{v_{des}(t) - v_{obs}(t)\}}{H(\omega)}\right\}$$

where $\gamma$ is a feedback constant smaller than unity. Typically, values much smaller than one, e.g., a tenth, are used to ensure convergence. In some cases, the transfer function may have nulls present that lead to instabilities in the iteration process. Therefore, it is sometimes useful to use only the phase of the transfer function to "point" the corrections in the right direction. In this case the iteration formula is, $$f_{new}(t) = f_{old}(t) + \gamma \cdot F^{-1}\left\{\frac{F\{v_{des}(t) - v_{obs}(t)\}}{e^{i\angle H(\omega)}}\right\}.$$

Figure 27A:
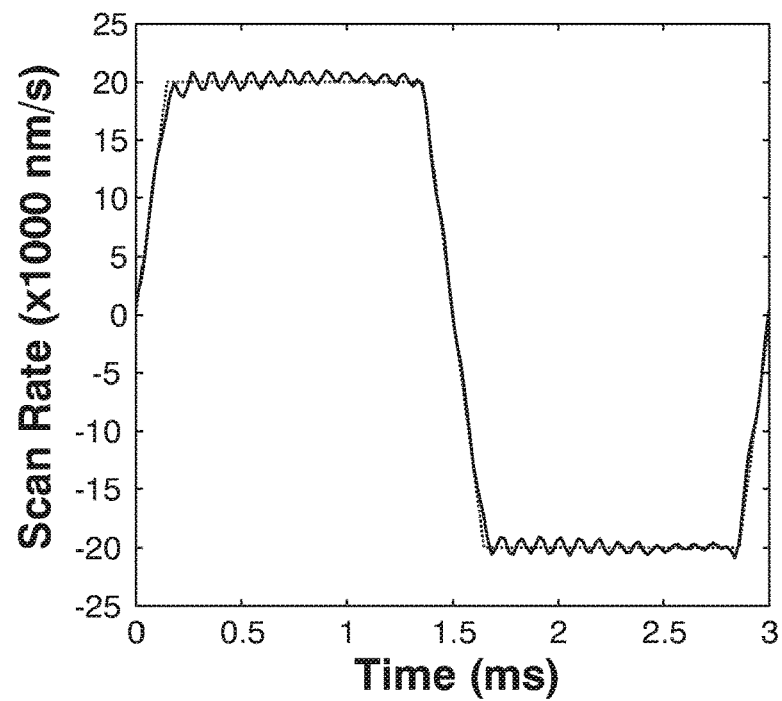
FIGS. 27A-27B show resulting scan speed response and absolute wavelength, respectively, after completion of successive approximation.
Figure 27B:
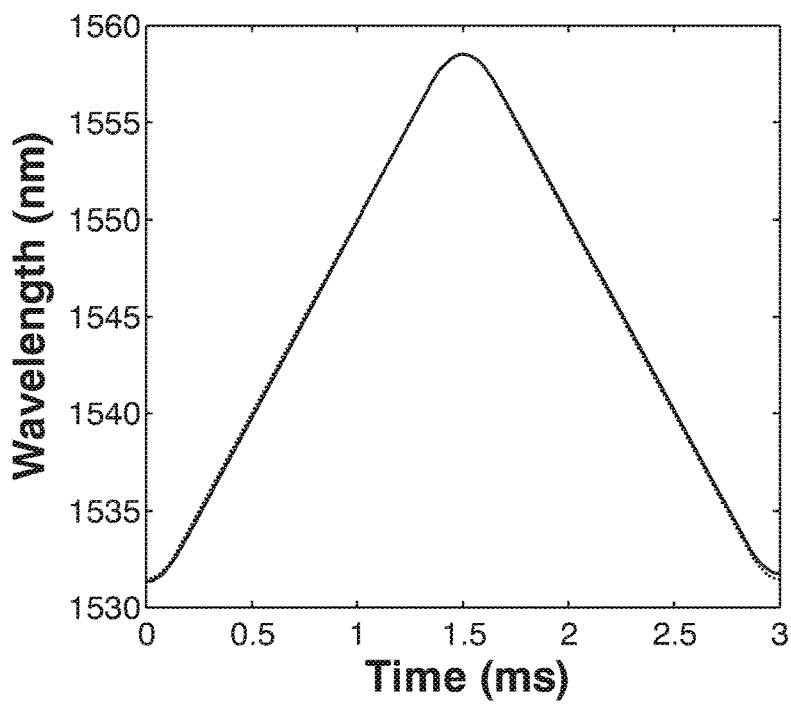

An example of the final result of this iterative process is shown below in FIGS. 27A and 27B. A small ~10 kHz oscillation is excited by the feedback control signal, but may be eliminated by further refinement of the process and a more gentle transition to the parabola and turnaround points. Very tight control is achieved at very high scan rates of a highly resonant, nonlinear actuator using this acausal, repetitive signal approach. The gas cell corrections described above can be run simultaneously with the iterative search for the optimal drive form. This entire process may be reduced to firmware and run continuously in the background as the laser is operating in this high speed sweeping mode.

Although various example embodiments have been shown and described in detail, the claims are not limited to any particular embodiment or example. None of the above description should be read as implying that any particular element, step, range, or function is essential such that it must be included in the claims scope. Reference to an element in the singular is not intended to mean "one and only one" unless explicitly so stated, but rather "one or more." The scope of patented subject matter is defined only by the claims. The extent of legal protection is defined by the words recited in the allowed claims and their equivalents. All structural and functional equivalents to the elements of the above-described example embodiment that are known to those of ordinary skill in the art are expressly incorporated herein by reference and are intended to be encompassed by the present claims. Moreover, it is not necessary for a device or method to address each and every problem sought to be solved by the present invention for it to be encompassed by the present claims. No claim is intended to invoke paragraph 6 of 35 USC § 112 unless the words "means for" or "step for" are used. Furthermore, no feature, component, or step in the present disclosure is intended to be dedicated to the public regardless of whether the feature, component, or step is explicitly recited in the claims.

What is claimed is:

1. A tunable laser control system for controlling a laser output of a tunable laser, the tunable laser arranged to be scanned over a range of frequencies, the tunable laser control system comprising:
an interferometer having a plurality of interferometer outputs, wherein at least two interferometer outputs of the plurality of interferometer outputs have a phase difference not equal to 0° and not equal to 180°;
a wavelength reference having a spectral feature within the range of frequencies, the spectral feature not changing in an expected operating environment of the tunable laser; and
processing circuitry to:
use the spectral feature and the plurality of interferometer outputs to produce an absolute measurement of a wavelength of the tunable laser;
compare the absolute measurement of the wavelength of the tunable laser with a setpoint wavelength to generate an error signal; and
control the tunable laser using a feedback signal based on the error signal,
wherein the processing circuitry comprises an analog feedback loop including first and second analog multipliers coupled to an analog differencer the analog feedback loop arranged to generate the error signal in analog form and control the wavelength of the tunable laser.

2. The tunable laser control system of claim 1, further comprising:
circuitry arranged to generate set points for interferometer outputs of the plurality of interferometer outputs, wherein the first and second analog multipliers are arranged to multiply the interferometer outputs with a corresponding one of the set points, and wherein the analog differencer is arranged to generate the error signal in analog form based on a difference between outputs from the first and second analog multipliers.

3. The tunable laser control system of claim 1, wherein the setpoint wavelength is determined based on a set point function that varies periodically with time, and wherein the processing circuitry further comprises:
circuitry arranged to use the error signal to control the set point function so that a periodic setpoint wavelength signal is generated.

4. The tunable laser control system of claim 1, wherein the tunable laser control system is a non-causal control system.

5. The tunable laser control system of claim 1, further comprising the tunable laser arranged to be scanned over a range of frequencies.

6. The tunable laser control system of claim 1, wherein the absolute measurement of the wavelength of the tunable laser has an accuracy better than an order of picometers, a precision better than an order of femtometers, and a drift better than an order of picometers.

7. The tunable laser control system of claim 1, wherein the wavelength reference comprises a gas cell, and the spectral feature comprises absorption line data of the gas cell.

8. The tunable laser control system of claim 7, wherein the processing circuitry is configured to use the spectral feature and the plurality of interferometer outputs to produce an absolute measurement of a wavelength of the tunable laser by:
the processing circuitry being configured to convert the plurality of interferometer outputs into a phase signal representative of a relative measurement of the wavelength of the tunable laser; and
the processing circuitry comprising reference calibration circuitry arranged to correct for accumulated scaling and tracking errors in the phase signal using the absorption line data.

9. The tunable laser control system of claim 8, wherein the reference calibration circuitry is arranged to identify one or more gas cell lines in the absorption line data.

10. The tunable laser control system of claim 8, wherein the reference calibration circuitry is arranged to use a difference between neighboring gas cell line values in the absorption line data to identify the absolute measurement of the wavelength of the tunable laser.

11. A tunable laser control system for controlling a laser output of a tunable laser, the tunable laser arranged to be scanned over a range of frequencies, the tunable laser control system comprising:
an interferometer having a plurality of interferometer outputs, wherein at least two interferometer outputs of the plurality of interferometer outputs have a phase difference not equal to 0° and not equal to 180°;
a wavelength reference having a spectral feature within the range of frequencies, the spectral feature not changing in an expected operating environment of the tunable laser; and
processing circuitry to:
use the spectral feature and the plurality of interferometer outputs to produce an absolute measurement of a wavelength of the tunable laser;
compare the absolute measurement of the wavelength of the tunable laser with a setpoint wavelength to generate an error signal; and
control the tunable laser using a feedback signal based on the error signal,
wherein the processing circuitry comprises:
a digital feedback loop arranged to digitally determine and generate the feedback signal in digital form, and
an analog feedback loop arranged to generate the feedback signal in analog form and control the wavelength of the tunable laser.

12. The tunable laser control system of claim 11, wherein the setpoint wavelength is determined based on a set point function that varies periodically with time, and wherein the processing circuitry comprises:
circuitry arranged to use the error signal to control the set point function so that a periodic setpoint wavelength signal is generated.

13. The tunable laser control system of claim 11, wherein the tunable laser control system is a non-causal control system.

14. The tunable laser control system of claim 11, wherein the absolute measurement of the wavelength of the tunable laser has an accuracy better than an order of picometers, a precision better than an order of femtometers, and a drift better than an order of picometers.

15. The tunable laser control system of claim 11, wherein the wavelength reference comprises a gas cell, and the spectral feature comprises absorption line data of the gas cell.

16. The tunable laser control system of claim 15, wherein the processing circuitry is configured to use the spectral feature and the plurality of interferometer outputs to produce an absolute measurement of a wavelength of the tunable laser by:

the processing circuitry being configured to convert the plurality of interferometer outputs into a phase signal representative of a relative measurement of the wavelength of the tunable laser; and the processing circuitry comprising reference calibration circuitry arranged to correct for accumulated scaling and tracking errors in the phase signal using the absorption line data.

17. A method for controlling a laser output, comprising:
scanning a tunable laser over a range of frequencies;
detecting a laser output of the tunable laser using an interferometer to generate at least two outputs with relative phases substantially other than 0° and substantially other than 180°;
providing the laser output to a wavelength reference, wherein the wavelength reference generates a spectral feature within the range of frequencies of the tunable laser, and wherein the spectral feature does not change in an expected environment of the tunable laser;
using the spectral feature of the wavelength reference and the at least two outputs to produce an absolute measurement of a wavelength of the tunable laser;
comparing the absolute measurement of the wavelength of the tunable laser with a setpoint wavelength and generating an error signal based on the comparing; and
controlling the wavelength of the tunable laser using a feedback signal based on the error signal,
wherein a digital feedback loop is used to digitally determine and generate the error signal in digital form, and wherein an analog feedback loop is used to generate the error signal in analog form and to control the wavelength of the tunable laser.

18. The method in claim 17, wherein:
the error signal provides directional information about a direction of the scanning of the tunable laser over the range of frequencies and provides absolute wavelength error information, and
the absolute wavelength error information has an accuracy better than an order of picometers, a precision better than an order of femtometers, and a drift better than an order of picometers.

19. The method in claim 17, wherein the tunable laser includes one or more laser actuators, wherein the digital feedback loop controls a lower-frequency regime of the one or more laser actuators, and wherein the analog feedback loop controls a higher-frequency regime of the one or more laser actuators.

20. The method in claim 17, wherein the setpoint wavelength is determined based on a set point function that varies periodically with time, the method further comprising:
using the error signal to control the set point function so that a periodic wavelength control signal is generated for achieving a desired periodic wavelength.

* * * * *

UNITED STATES PATENT AND TRADEMARK OFFICE
CERTIFICATE OF CORRECTION

PATENT NO. : 10,502,632 B2
APPLICATION NO. : 15/677146
DATED : December 10, 2019
INVENTOR(S) : Seeley et al.

Page 1 of 1

It is certified that error appears in the above-identified patent and that said Letters Patent is hereby corrected as shown below:

In the Claims

In Column 25, Line 32, in Claim 1, delete "differencer" and insert --differencer,-- therefor Signed and Sealed this
Twenty-fourth Day of March, 2020

Andrei Iancu
*Director of the United States Patent and Trademark Office*